(12) United States Patent
Yamamoto et al.

(10) Patent No.: US 9,640,387 B2
(45) Date of Patent: May 2, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Ryuji Yamamoto, Kodaira (JP); Tsukasa Kamakura, Toyama (JP); Yoshiro Hirose, Toyama (JP); Satoshi Shimamoto, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/838,793

(22) Filed: Aug. 28, 2015

(65) Prior Publication Data

US 2016/0064219 A1 Mar. 3, 2016

(30) Foreign Application Priority Data

Sep. 2, 2014 (JP) .................................. 2014-177763

(51) Int. Cl.
*H01L 21/02* (2006.01)
*C23C 16/44* (2006.01)

(52) U.S. Cl.
CPC .... *H01L 21/02334* (2013.01); *C23C 16/4405* (2013.01)

(58) Field of Classification Search
CPC ............. H01L 21/02334; C23C 16/455; C23C 16/258; C23C 16/26; C23C 16/52
See application file for complete search history.

(56) References Cited

U.S. PATENT DOCUMENTS

| 5,709,757 | A | * | 1/1998 | Hatano | ...................... B08B 7/00 118/715 |
| 8,329,599 | B2 | | 12/2012 | Fukazawa et al. | |
| 2002/0034862 | A1 | * | 3/2002 | Wada | ....................... C23C 16/40 438/484 |
| 2005/0145177 | A1 | * | 7/2005 | McSwiney | ............ C23C 16/345 118/723 MA |
| 2008/0132083 | A1 | | 6/2008 | Matsuura | |
| 2010/0196626 | A1 | * | 8/2010 | Choi | ................... C23C 16/4585 427/569 |

(Continued)

FOREIGN PATENT DOCUMENTS

JP 03-083893 A 4/1991
JP 2001-093877 A 4/2001

(Continued)

*Primary Examiner* — Whitney T Moore
*Assistant Examiner* — Joseph Galvin, III
(74) *Attorney, Agent, or Firm* — Volpe and Koenig, P.C.

(57) ABSTRACT

A technique includes loading a substrate into a process chamber, supporting the substrate by a mounting table having a heater therein in the process chamber, forming a film on the substrate by supplying a processing gas into the process chamber in a state where the mounting table having the substrate supported thereon is disposed in a first position and the heater is turned on, unloading the substrate on which the film is formed, and supplying a reactive gas into the process chamber in a state where the mounting table is disposed in a second position and the heater is turned on. The second position is closer to a ceiling portion in the process chamber than the first position.

21 Claims, 13 Drawing Sheets

(56) References Cited

U.S. PATENT DOCUMENTS

2013/0065402 A1* 3/2013 Kameda .................... B08B 9/08
                                                                438/758
2014/0179085 A1    6/2014 Hirose et al.

FOREIGN PATENT DOCUMENTS

| | | |
|---|---|---|
| JP | 2002-093790 A | 3/2002 |
| JP | 2008-140864 A | 6/2008 |
| JP | 3147868 U | 12/2008 |
| JP | 2013-089682 A | 5/2013 |
| JP | 2014-127524 A | 7/2014 |

* cited by examiner

FIG. 6
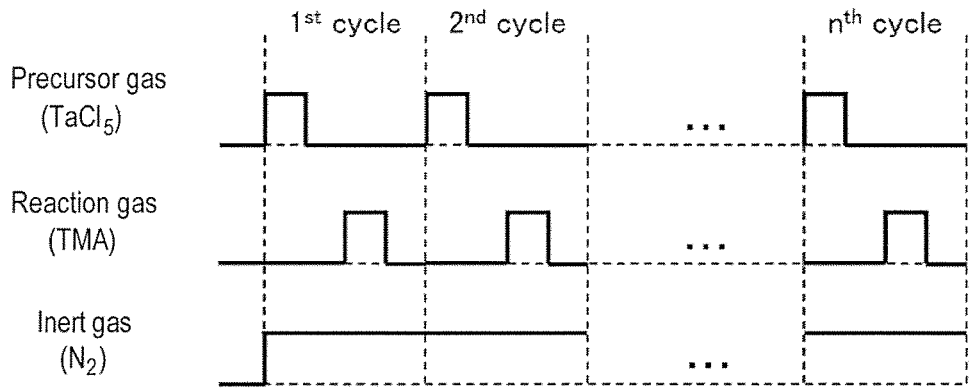
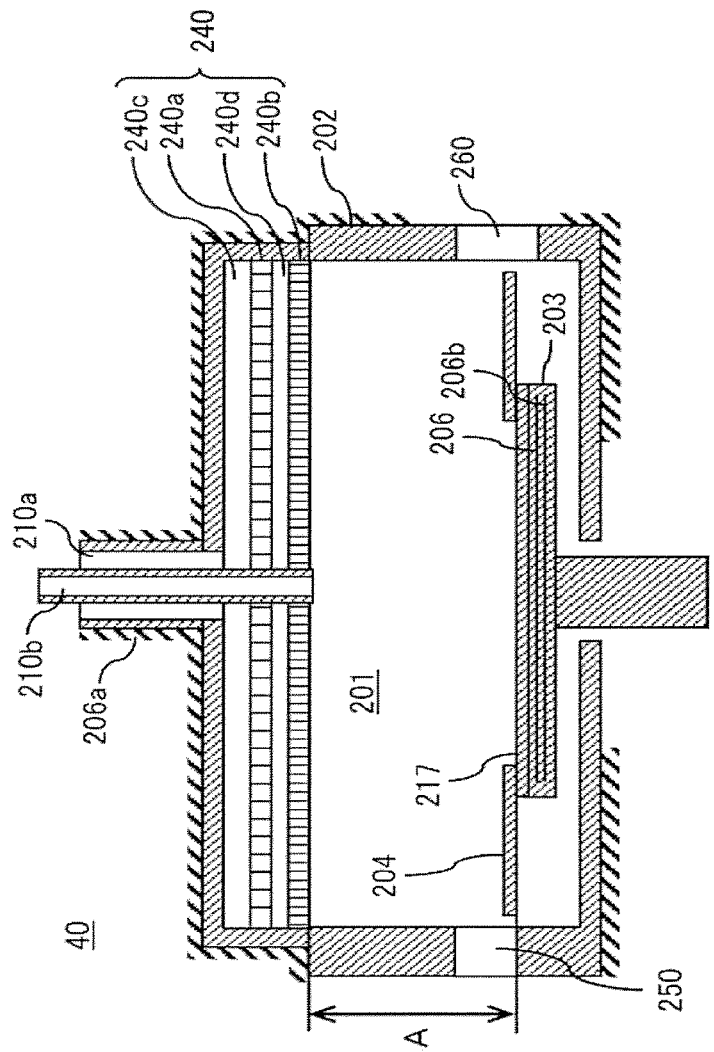
FIG. 7A

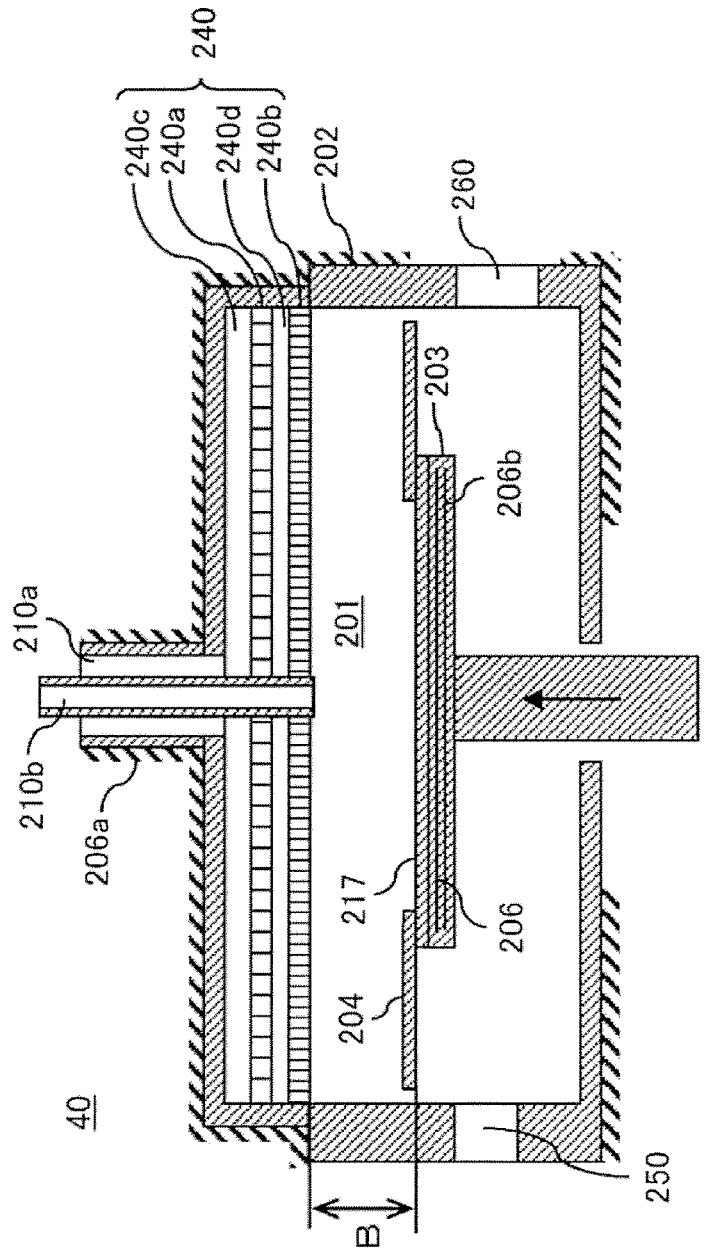

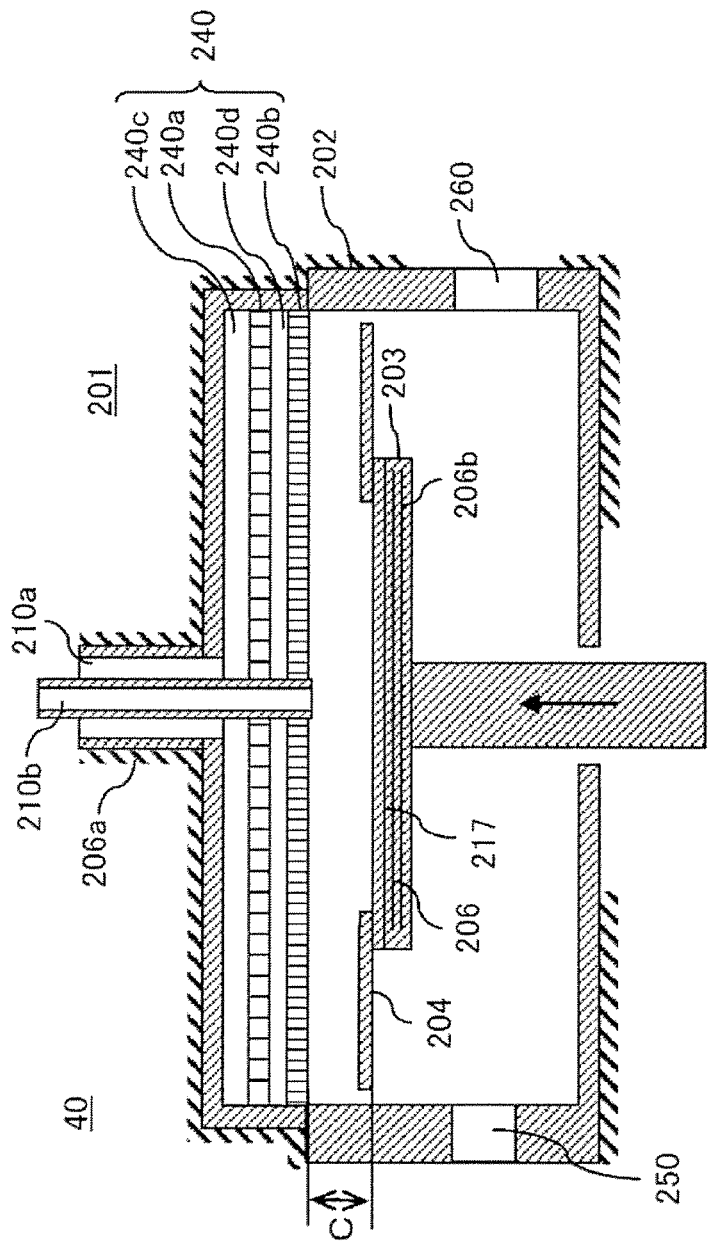

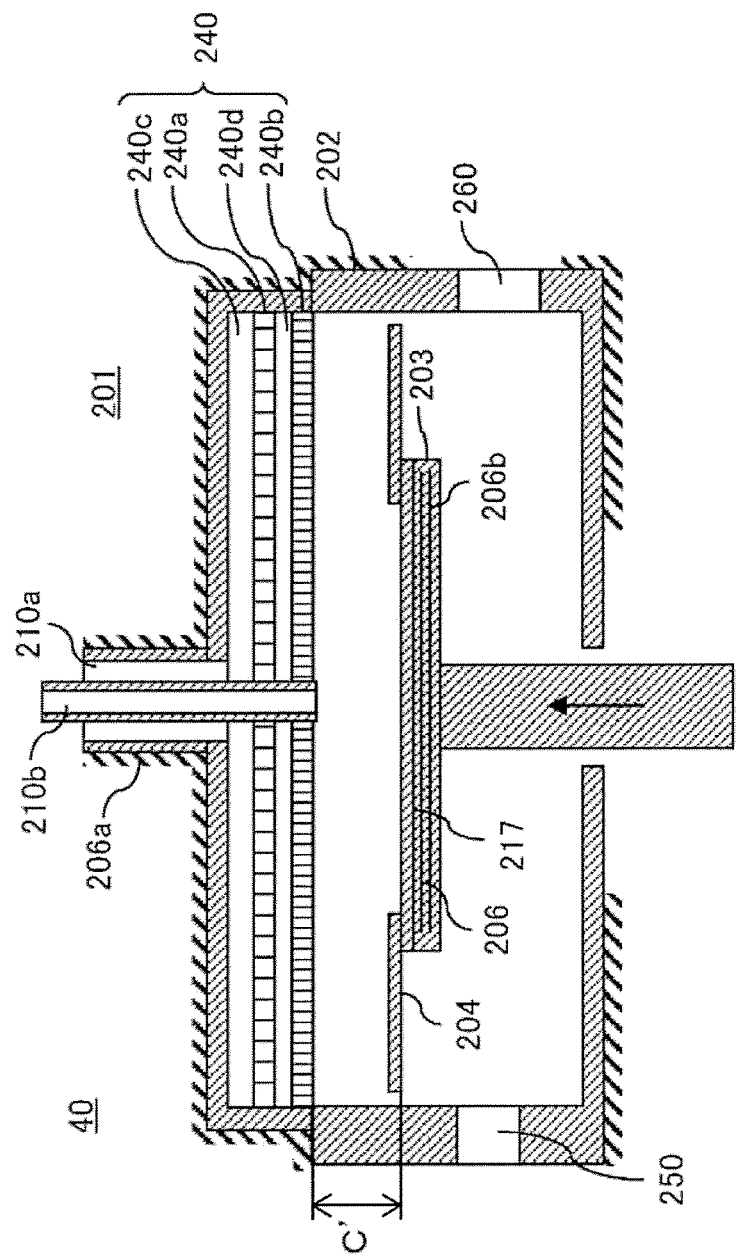

METHOD OF MANUFACTURING SEMICONDUCTOR DEVICE, SUBSTRATE PROCESSING APPARATUS, AND RECORDING MEDIUM

CROSS-REFERENCE TO RELATED APPLICATIONS

This application is based upon and claims the benefit of priority from Japanese Patent Application No. 2014-177763, filed on Sep. 2, 2014, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of forming a film on a substrate is often carried out by supplying a processing gas to the substrate in a process chamber.

In some cases, when performing the aforementioned film forming process, deposits are attached onto members in the process chamber as well as a substrate. The deposits may cause particles (e.g., foreign materials) in the process chamber and thus become one of the factors for reducing the quality of the film forming process.

SUMMARY

The present disclosure provides some embodiments of a technique capable of suppressing the generation of particles in the process chamber in which the film forming process is performed.

According to one embodiment of the present disclosure, there is provided a technique which includes loading a substrate into a process chamber, supporting the substrate by a mounting table having a heater therein in the process chamber, forming a film on the substrate by supplying a processing gas into the process chamber in a state where the mounting table having the substrate supported thereon is disposed in a first position and the heater is turned on, unloading the substrate on which the film is formed from the process chamber, and supplying a reactive gas into the process chamber in a state where the mounting table is disposed in a second position and the heater is turned on, the second position being closer to a ceiling portion in the process chamber than the first position.

BRIEF DESCRIPTION OF THE DRAWINGS

FIG. 6 is a diagram showing timings of supplying gases in a film forming sequence of another embodiment of the present disclosure.

FIGS. 7A to 7D are views showing a state of a mounting table moved to a wafer transfer position, a state of the mounting table moved to a wafer processing position, a state of the mounting table moved to a deposit modification position, and a state of the mounting table moved to a cleaning position, respectively.

DETAILED DESCRIPTION

Embodiment of Present Disclosure

Hereinafter, one embodiment of the present disclosure will be described mainly with reference to FIGS. 1 to 3.

(1) CONFIGURATION OF SUBSTRATE PROCESSING APPARATUS

Figure 1:
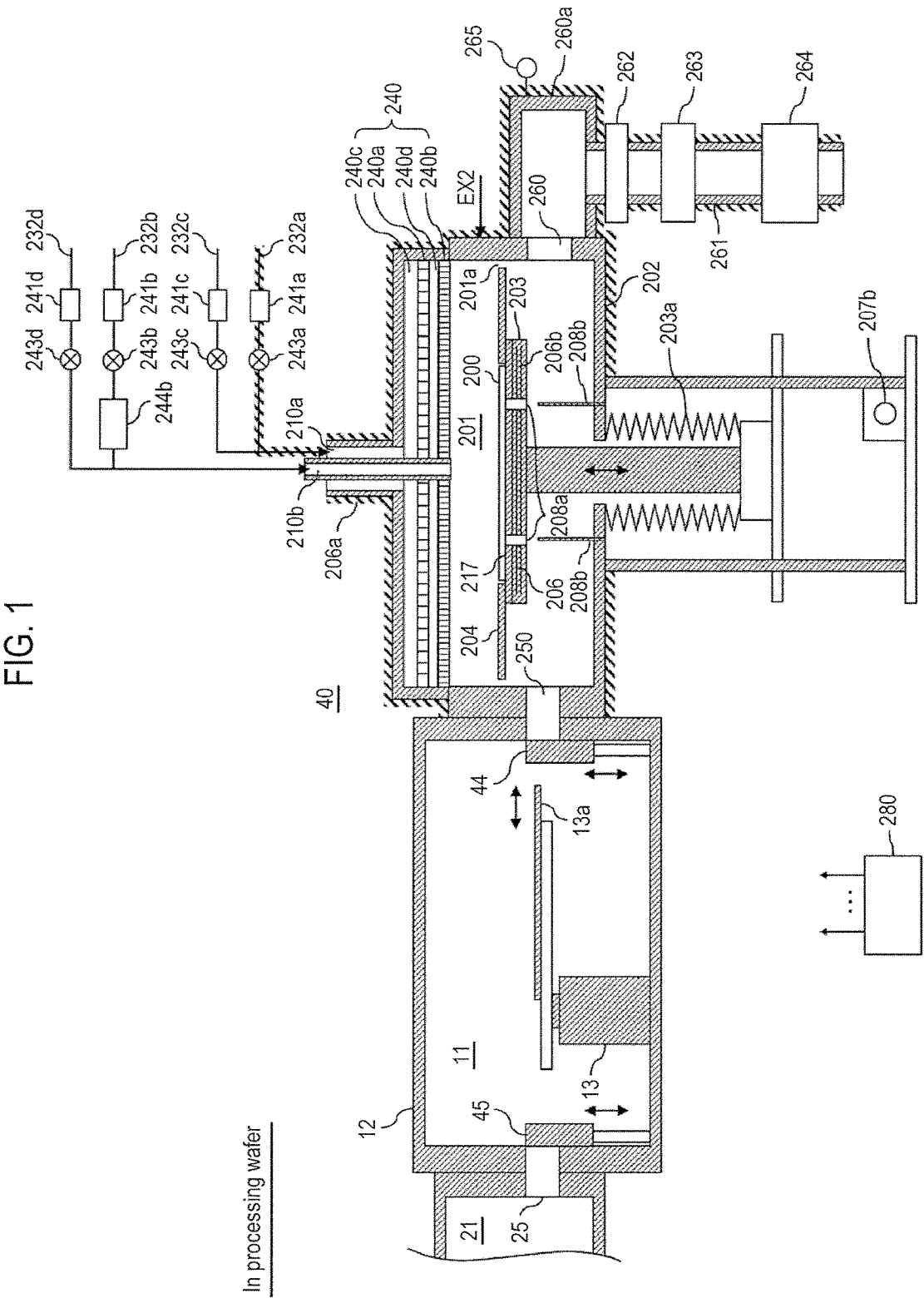
FIG. 1 is a sectional view of a configuration of a substrate processing apparatus appropriately used in one embodiment of the present disclosure when a wafer is processed.
Figure 2:
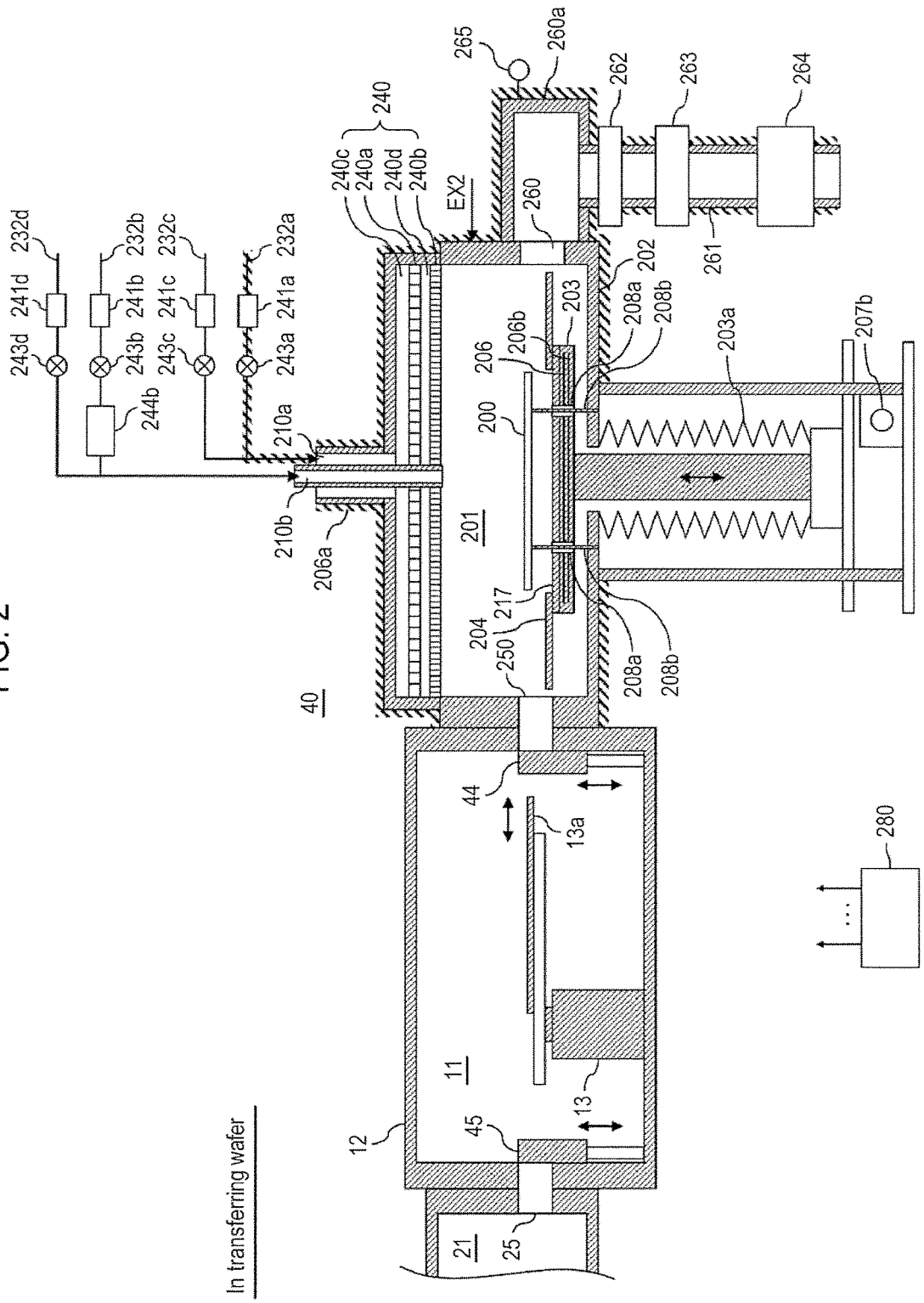
FIG. 2 is a sectional view of a configuration of a substrate processing apparatus appropriately used in one embodiment of the present disclosure when a wafer is transferred.

As shown in FIGS. 1 and 2, a substrate processing apparatus 40 is provided with a process vessel 202. The process vessel 202 is configured, for example, as a flat airtight vessel having a circular horizontal cross section. The process vessel 202 is made, for example, of a metal material, such as aluminum (Al) or stainless steel (SUS). A process chamber 201, in which a wafer 200, such as a silicon wafer, as a substrate is processed, is defined in the process vessel 202. A sub-heater 206a capable of heating the process vessel 202, or a shower head 240, a gas supply pipe 232a, an exhaust chamber 260a, an exhaust pipe 261 or the like, which will be described later, for example, to several tens to 150 degrees C. or so, is installed around these members.

A mounting table 203 for supporting the wafer 200 is installed within the process chamber 201. A susceptor 217, which is a support plate, for example, made of quartz ($SiO_2$), carbon, ceramics, silicon carbide (SiC), alumina ($Al_2O_3$), aluminum nitride (AN) or the like, is installed on an upper surface of the mounting table 203, which the wafer 200 is brought into direct contact with.

A rectifying plate (conductance plate) 204, which is configured as a disc in the shape of circular annulus (ring), is installed in an outer peripheral portion of the susceptor 217 to surround the support region of the wafer 200. The level of the upper surface of the rectifying plate 204 is set to be nearly equal to the level of a surface (surface to be processed) of the wafer 200 held on the susceptor 217. A gap 201a having a predetermined width is defined between a peripheral portion of the rectifying plate 204 and a lateral surface of an inner wall of the process chamber 201 (the process vessel 202). The gap 201a functions as a discharge opening that allows the gas supplied to the wafer 200 to flow toward an exhaust opening 260 described later.

A heater 206 that is a heating means (heating mechanism) for heating the wafer 200 and a temperature sensor 206b that is a temperature detector are embedded in the mounting table 203. Based on the temperature information detected by the temperature sensor 206b, an electric conduction state to the heater 206 is adjusted such that the wafer 200 supported on the susceptor 217 has a desired temperature. A lower end of the mounting table 203 penetrates through a bottom portion of the process vessel 202.

An elevation mechanism 207b that is a mounting table moving part for elevating the mounting table 203 is installed outside the process chamber 201. By operating the elevation mechanism 207b to elevate the mounting table 203, it is possible to elevate the wafer 200 supported on the susceptor 217. The mounting table 203 is moved down to the position shown in FIG. 2 (a wafer transfer position) when the wafer 200 is transferred and moved up to the position shown in FIG. 1 (a wafer processing position) when the wafer 200 is processed. A periphery of the lower end of the mounting table 203 is covered with a bellows 203a, so that the interior of the process chamber 201 is maintained airtight.

For example, three, lift pins 208b are installed to extend in the vertical direction in a lower surface (bottom surface) of the process chamber 201. Through holes 208a allowing the lift pins 208b to penetrate therethrough are formed in the mounting table 203 (also including the susceptor 217) at positions corresponding to the lift pins 208b, respectively. When the mounting table 203 is moved down to the wafer transfer position, as shown in FIG. 2, upper ends of the lift pins 208b protrude from the upper surface of the susceptor 217, so that the lift pins 208b support the wafer 200 from below. When the mounting table 203 is moved up to the wafer processing position, as shown in FIG. 1, the upper ends of the lift pins 208b are retracted from the upper surface of the susceptor 217, so that the susceptor 217 supports the wafer 200 from below. Since the lift pins 208b are brought in direct contact with the wafer 200, the lift pins 208b may be made of for example, material such as quartz or alumina.

A wafer transfer port 250 configured to allow the wafer 200 to be transferred into or out of the process chamber 201 is formed in the lateral surface of the inner wall of the process chamber 201 (the process vessel 202). A gate valve 44 is installed at the wafer transfer port 250, and it is possible for the interior of the process chamber 201 to be in communication with the interior of a transfer chamber 11 by opening the gate valve 44. The transfer chamber 11 is defined in a transfer vessel (airtight vessel) 12, and a transfer robot 13 configured to transfer the wafer 200 is installed in the transfer chamber 11. The transfer robot 13 is provided with a transfer arm 13a which supports the wafer 200 when the wafer 200 is transferred. In the state that the mounting table 203 is moved down to the wafer transfer position, the gate valve 44 is opened, thereby making it possible for the transfer robot 13 to transfer the wafer 200 between the interior of the process chamber 201 and the interior of the transfer chamber 11. That is, the transfer robot 13 includes a transfer unit (transfer mechanism) configured to transfer the wafer 200 into or out of the process chamber 201. The wafer 200 transferred into the process chamber 201 is temporarily mounted on the lift pins 208b, as described above. A load lock chamber 21 is installed opposite to the side, in which the wafer transfer port 250 of the transfer chamber 11 is formed, via a gate valve 45, thereby making it possible for the transfer robot 13 to transfer the wafer 200 between the interior of the load lock chamber 21 and the interior of the transfer chamber 11. The load lock chamber 21 functions as a preliminary chamber that temporarily accommodates the wafer 200 which is not processed or has been processed.

The exhaust opening 260 configured to exhaust an atmosphere in the process chamber 201 is formed in the lateral surface of the inner wall of the process chamber 201 (the process vessel 202) opposite to the wafer transfer port 250. The exhaust pipe 261 is connected to the exhaust opening 260 via the exhaust chamber 260a. A pressure sensor 265 that is a pressure detector (pressure detecting part) for detecting an internal pressure of the process chamber 201 is installed at the exhaust chamber 260a. A vacuum pump 264 that is a vacuum exhaust device is connected to the exhaust pipe 261 via an APC (Auto Pressure Controller) valve 262 that is a pressure adjuster (pressure adjusting part) for controlling the internal pressure of the process chamber 201 to a predetermined pressure and a raw material collection trap 263. The APC valve 262 is configured to perform/stop vacuum exhaust in the process chamber 201 by opening/closing the valve with the vacuum pump 264 actuated, and further to adjust the internal pressure of the process chamber 201 by adjusting a degree of the valve opening with the actuated vacuum pump 264. The APC valve 262 may be referred to as an exhaust valve. An exhaust system (exhaust line) is mainly configured by the exhaust chamber 260a, the pressure sensor 265, the exhaust pipe 261, and the APC valve 262. The raw material collection trap 263 and the vacuum pump 264 may be included in the exhaust system.

A gas supply port 210a for supplying a predetermined gas into the process chamber 201 and a gas supply port 210b for supplying a predetermined gas into the process chamber 201 are formed in an upper surface (ceiling wall) of the later-described shower head 240, which is installed at the ceiling portion (upper portion) of the process chamber 201. The gas supply port 210b is formed independently of the gas supply port 210a. Further, although FIGS. 1 and 2 illustrate the configuration that the gas supply port 210b is disposed inside the gas supply port 210a to be concentric with the gas supply port 210a, the present disclosure is not limited thereto and the gas supply port 210b may be provided outside the gas supply port 210a. Configurations of gas supply systems respectively connected to the gas supply ports 210a and 210b will be described later.

The shower head 240 that is a gas diffusion mechanism is installed between the gas supply port 210a and the process chamber 201. The shower head 240 includes a diffusion plate 240a configured to diffuse the gas supplied from the gas supply port 210a, and a shower plate 240b configured to diffuse the gas passing through the diffusion plate 240a to be more uniform and supply the gas to the surface of the wafer 200 on the mounting table 203. The diffusion plate 240a and the shower plate 240b each have a plurality of vent holes formed therein. The diffusion plate 240a is disposed to face the upper surface of the shower head 240 and the shower plate 240b. The shower plate 240b is disposed to face the wafer 200 on the mounting table 203. Spaces are defined between the upper surface of the shower head 240 and the diffusion plate 240a and between the diffusion plate 240a and the shower plate 240b, respectively. These spaces function as a first buffer space (diffusion chamber) 240c configured to diffuse the gas supplied from the gas supply port 210a and a second buffer space 240d configured to spread the gas passing through the diffusion plate 240a, respectively.

The gas supply port 210b is formed such that the gas supply port 210b penetrates through the shower head 240 in the vertical direction (thickness direction) and the lower end opening of the gas supply port 210b protrudes from the lower surface of the shower plate 240b toward the mounting table 203. The gas supply port 210b is configured to supply the gas into the process chamber 201 from the lower side of the shower plate 240b, i.e., without passing through the shower head 240.

Here, the flow of the gas in the process chamber 201 in processing a wafer will be described.

The gas supplied from the gas supply port 210a to the upper portion of the shower head 240 goes through the first buffer space 240c, flows into the second buffer space 240d from the plurality of holes of the diffusion plate 240a, passes through the plurality of holes of the shower plate 240b, and then is supplied into the process chamber 201. In addition, the gas supplied from the gas supply port 210b is supplied into the process chamber 201 from the lower side of the shower plate 240b, i.e., without passing through the shower head 240.

The gas supplied into the process chamber 201 is uniformly supplied onto the wafer 200 and then radially flows toward the outside of the wafer 200 in the diameter direction. Then, a surplus gas remaining after the gas is brought into contact with the wafer 200 radially flows on the rectifying plate 204, which is positioned in an outer peripheral portion of the wafer 200, toward the outside of the wafer 200 in the diameter direction. Thereafter, the surplus gas passes through the gap 201a defined between the peripheral portion of the rectifying plate 204 and the lateral surface of the inner wall of the process chamber 201 and then is exhausted from the exhaust opening 260.

Then, the configurations of the gas supply systems connected to gas supply ports 210a and 210b will be described.

The gas supply pipes 232a and 232b are connected to the gas supply ports 210a and 210b, respectively. Mass flow controllers (MFCs) 241a and 241b, which are flow rate controllers (flow rate control parts), and valves 243a and 243b, which are opening/closing valves, are installed on the gas supply pipes 232a and 232b in this order from an upstream direction, respectively. A remote plasma unit (RPU) 244b, which is a plasma generator, is installed on the gas supply pipe 232b at a downstream side of the valve 243b. Gas supply pipes 232c and 232d each configured to supply an inert gas are connected to the gas supply pipes 232a and 232b at downstream sides of the valves 243a and 243b, respectively. MFCs 241c and 241d, which are flow rate controllers (flow rate control parts), and valves 243c and 243d, which are opening/closing valves, are installed on the gas supply pipes 232c and 232d in this order from an upstream direction, respectively.

As a precursor gas having a chemical bonding of a first element and carbon (C), an alkylenehalosilane precursor gas containing Si as a first element, an alkylene group and a halogen group and having a chemical bonding of Si and C (Si—C bonding), or an alkylhalosilane precursor gas containing Si, an alkyl group and a halogen group and having Si—C bonding, for example, is supplied from the gas supply pipe 232a into the process chamber 201 through the MFC 241a, the valve 243a, the gas supply port 210a, and the shower head 240.

Here, the alkylene group is a functional group obtained by removing two hydrogen atoms (H) from a chain-like saturated hydrocarbon (alkane) represented by a general formula $C_nH_{2n+2}$, and is an aggregate of atoms represented by a general formula $C_nH_{2n}$. The alkylene group includes a methylene group, an ethylene group, a propylene group, a butylene group and the like. Also, the alkyl group is a functional group obtained by removing one hydrogen atom from chain-like saturated hydrocarbon represented by a general formula $C_nH_{2n+2}$, and is an aggregate of atoms represented by a general formula $C_nH_{2n+1}$. The alkyl group includes a methyl group, an ethyl group, a propyl group, a butyl group and the like.

Also, the halogen group includes a chloro group, a fluoro group, a bromo group, an iodine group and the like. That is, the halogen group includes halogen elements such as chlorine (Cl), fluorine (F), bromine (Br), and iodine (I).

The alkylenehalosilane precursor gas may include, for example, a precursor gas containing Si, a methylene group (—$CH_2$—) as the alkylene group and a chloro group (Cl) as the halogen group, i.e., a chlorosilane precursor gas containing a methylene group, or a precursor gas containing Si, an ethylene group (—$C_2H_4$—) as the alkylene group and a chloro group (Cl) as the halogen group, i.e., a chlorosilane precursor gas containing an ethylene group. The chlorosilane precursor gas containing a methylene group may include, for example, methylenebis(trichlorosilane) gas, i.e., bis(trichlorosilyl)methane (($SiCl_3)_2CH_2$, abbreviation: BTCSM) gas and the like. The chlorosilane precursor gas containing the ethylene group may include, for example, ethylenebis(trichlorosilane) gas, i.e., 1,2-bis(trichlorosilyl)ethane (($SiCl3)_2C_2H_4$, abbreviation: BTCSE) gas or the like.

Figure 9A:
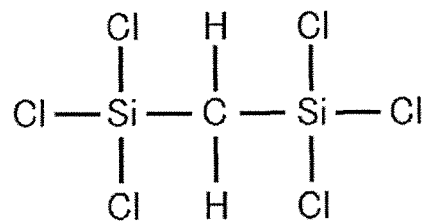
FIGS. 9A to 9E are views showing a chemical structural formula of BTCSM, a chemical structural formula of BTCSE, a chemical structural formula of TCDMDS, a chemical structural formula of DCTMDS, and a chemical structural formula of MCPMDS, respectively.

As shown in FIG. 9A, BTCSM includes one methylene group as an alkylene group in the chemical structural formula (one molecule) thereof. Two bonding electrons in the methylene group are respectively bonded to Si, thereby forming an Si—C—Si bonding.

Figure 9B:
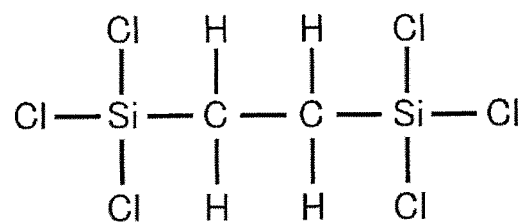

As shown in FIG. 9B, BTCSE includes one ethylene group as an alkylene group in one molecule thereof. Two bonding electrons in the ethylene group are respectively bonded to Si, thereby forming an Si—C—C—Si bonding.

The alkylhalosilane precursor gas may include, for example, a precursor gas containing Si, a methyl group (—$CH_3$) as the alkyl group and a chloro group (Cl) as the halogen group, i.e., a chlorosilane precursor gas containing a methyl group. The chlorosilane precursor gas containing a methyl group may include, for example, 1,1,2,2-tetrachloro-1,2-dimethyldisilane (($CH_3)_2Si_2Cl_4$, abbreviation: TCDMDS) gas, 1,2-dichloro-1,1,2,2-tetramethyldisilane (($CH_3)_4Si_2Cl_2$, abbreviation: DCTMDS) gas, 1-monochloro-1,1,2,2,2-pentamethyldisilane (($CH_3)_5Si_2Cl$, abbreviation: MCPMDS) gas or the like. The alkylhalosilane precursor gas such as the TCDMDS gas, the DCTMDS gas, and the MCPMDS gas is different from the alkylenehalosilane precursor gas such as the BTCSE gas, the BTCSM gas and the like, and may be a gas having an Si—Si bonding, i.e., a precursor gas containing first elements and a halogen element and having a chemical bonding of the first elements.

Figure 9C:
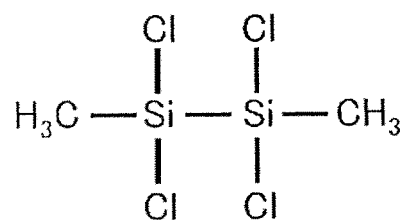

As shown in FIG. 9C, TCDMDS includes two methyl groups as alkyl groups in one molecule thereof. A bonding electron in each of the two methyl groups is bonded to Si, thereby forming an Si—C bonding. TCDMDS is a disilane derivative and has an Si—Si bonding. That is, the TCDMDS has an Si—Si—C bonding in which Si is bonded to Si and also bonded to C.

Figure 9D:
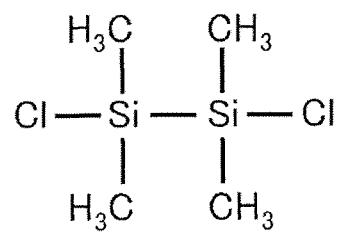

As shown in FIG. 9D, DCTMDS includes four methyl groups as alkyl groups in one molecule thereof. A bonding electron in each of the four methyl groups is bonded to Si, thereby forming an Si—C bonding. DCTMDS is a disilane derivative and has an Si—Si bonding. That is, the DCTMDS has an Si—Si—C bonding in which Si is bonded to Si and also bonded to C.

Figure 9E:
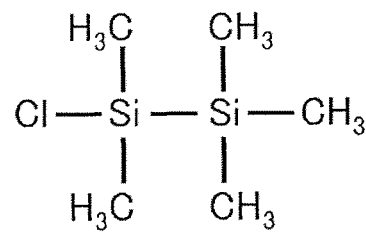

As shown in FIG. 9E, MCPMDS includes five methyl groups as alkyl groups in one molecule thereof. A bonding electron in each of the five methyl groups is bonded to Si, thereby forming an Si—C bonding. The MCPMDS is a disilane derivative and has an Si—Si bonding. That is, the MCPMDS has an Si—Si—C bonding in which Si is bonded to Si and also bonded to C. Unlike the BTCSM, the BTCSE, the TCDMDS, the DCTMDS and the like, the MCPMDS has an asymmetrical structure where arrangement of the methyl groups and chloro groups surrounding Si is asymmetrical in one MCPMDS molecule (in its chemical structural formula). Thus, this embodiment may employ not only precursors having the symmetrical chemical structural formulas shown in FIGS. 9A to 9D but also precursors having the asymmetrical chemical structural formula.

The alkylenehalosilane precursor gas, such as the BTCSM gas or the BTCSE gas, or the alkylhalosilane precursor gas, such as the TCDMDS gas, the DCTMDS gas, or the MCPMDS gas, may be referred to as a precursor gas containing not only at least two silicon atoms (Si) but also C and Cl and having an Si—C bonding in one molecule thereof. These gases function as an Si source as well as a C source in a substrate processing process (a film forming process) described later. The BTCSM gas, the BTCSE gas or the like may be referred to as an alkylenechlorosilane precursor gas. The TCDMDS gas, the DCTMDS gas or the like may be referred to as an alkylchlorosilane precursor gas.

Herein, the term "precursor gas" refers to a precursor in a gaseous state, for example, a gas obtained by evaporating a precursor staying in a liquid state at normal temperature under normal pressure, or a precursor in a gaseous state at normal temperature under normal pressure. When the term "precursor" is used herein, it includes "a liquid precursor in a liquid state," "a precursor gas in a gaseous state," or both. When a liquid precursor in a liquid state at normal temperature under normal pressure, such as BTCSM, is used, the liquid precursor is vaporized by a vaporization system, such as a vaporizer or a bubbler, and supplied as a precursor gas (BTCSM gas or the like).

In addition, as a reactive gas reacting with the deposits deposited on the interior surface of the shower head 240 or the interior surface of the process chamber 201, a modifying gas for reacting with and modify the deposits, for example, may be supplied from the gas supply pipe 232a into the process chamber 201 through the MFC 241a, the valve 243a, the gas supply port 210a, and the shower head 240. The modifying gas may include, for example, oxygen ($O_2$) gas.

In addition, as a reactive gas reacting with the deposits deposited on the interior surface of the shower head 240 or the interior surface of the process chamber 201, a cleaning gas for etching the deposits to remove them, for example, may be supplied from the gas supply pipe 232a into the process chamber 201 through the MFC 241a, the valve 243a, the gas supply port 210a, and the shower head 240. The cleaning gas may include, for example, fluorine ($F_2$) gas.

Further, as a gas for promoting the heat conduction of respective members in the shower head 240 or the process chamber 201 through an atmosphere therein when a modification process of deposit or a cleaning process described later is performed, a gas having a heat conductivity higher than the above-described reactive gas (hereinafter, referred to as a heating promotion gas), for example, may be supplied from the gas supply pipe 232a into the process chamber 201 through the MFC 241a, the valve 243a, the gas supply port 210a, and the shower head 240. The heating promotion gas may include, for example, hydrogen ($H_2$) gas.

Further, as a reaction gas containing elements (second to fourth elements) different from the above-described first element, a nitrogen-containing (N-containing) gas, for example, is supplied from the gas supply pipe 232b into the process chamber 201 through the MFC 241b, the valve 243b, the RPU 244b, and the gas supply port 210b. The N-containing gas may include, for example, a hydronitrogen-based gas. The hydronitrogen-based gas may be referred to as a substance consisting of only two elements of N and H and functions as a nitriding gas, i.e., an N source, in the film forming process described later. The hydronitrogen-based gas may include, for example, ammonia ($NH_3$) gas.

Further, as a reaction gas containing elements (second to fourth elements) different from the above-described first element, for example, an oxygen-containing (O-containing) gas may be supplied from the gas supply pipe 232b into the process chamber 201 through the MFC 241b, the valve 243b, the RPU 244b, and the gas supply port 210b. The O-containing gas functions as an oxidizing gas, i.e., an O source in the film forming process described later. The O-containing gas may include, for example, $O_2$ gas.

Further, as a reaction gas containing elements (second to fourth elements) different from the above-described first element, a gas containing nitrogen (N) and carbon (C), for example, may be supplied from the gas supply pipe 232b into the process chamber 201 through the MFC 241b, the valve 243b, the RPU 244b, and the gas supply port 210b. The gas containing N and C may include, for example, an amine-based gas.

The amine-based gas refers to a gas containing an amine group, such as amine in a gas state, for example, a gas obtained by vaporizing amine in a liquid state at normal temperature under normal pressure, amine in a gas state at normal temperature under normal pressure, and the like. The amine-based gas includes amines such as ethylamine, methylamine, propylamine, isopropylamine, butylamine, and isobutylamine. The amine is a generic name of a compound in which hydrogen (H) of ammonia ($NH_3$) is substituted with a hydrocarbon group such as an alkyl group. The amine includes a hydrocarbon group, such as an alkyl group, as a ligand containing C, i.e., an organic ligand. The amine-based gas contains three elements of C, N and H, and may be referred to as an Si-free gas in that the amine-based gas does not contain Si and is also referred to as an Si-free and metal-free gas in that the amine-based gas does not contain Si and metal. The amine-based gas may be referred to as a substance consisting of only three elements of C, N and H. The amine-based gas functions as not only an N source but also a C source in the film forming process described later. When the term "amine" is used herein, it includes "an amine in a liquid state," "an amine-based gas in a gaseous state," or both.

The amine-based gas may include, for example, triethylamine (($C_2H_5$)$_3$N, abbreviation: TEA) gas, which has a plurality of ligands containing C (ethyl groups) in the chemical structural formula (one molecule) thereof and has more carbon atoms than nitrogen atoms in its one molecule. When an amine in a liquid state at normal temperature under normal pressure, such as TEA, is used, the amine in a liquid state is vaporized by a vaporization system, such as a vaporizer or a bubbler, and supplied as an amine-based gas (TEA gas).

Further, as a reaction gas containing elements (second to fourth elements) different from the above-described first element, a borazine ring skeleton-free and boron-containing (B-containing) gas, for example, may be supplied from the gas supply pipe 232b into the process chamber 201 through the MFC 241b, the valve 243b, the RPU 244b, and the gas supply port 210b. The borazine ring skeleton-free and B-containing gas may include, for example, a borane-based gas.

The borane-based gas refers to a borane compound in a gaseous state, for example, a gas obtained by evaporating a borane compound staying in a liquid state at normal temperature under normal pressure, or a borane compound in a gaseous state at normal temperature under normal pressure. The borane compound includes a haloborane compound containing B and a halogen element, for example, a chloroborane compound containing B and Cl. In addition, the borane compound includes, a borane (boron hydride) such as monoborane ($BH_3$) or diborane ($B_2H_6$), or a borane compound (a borane derivative) in which H of borane is substituted with another element or the like. The borane-based gas functions as a B source in the film forming process described later. The borane-based gas may include, for example, trichloroborane ($BCl_3$) gas. The $BCl_3$ gas is a borazine ring skeleton-free and B-containing gas, i.e., a non-borazine-based B-containing gas.

In addition, as a reaction gas containing elements (second to fourth elements) different from the above-described first element, a gas containing a borazine ring skeleton, for example, may be supplied from the gas supply pipe 232b into the process chamber 201 through the MFC 241b, the valve 243b, the RPU 244b, and the gas supply port 210b. The gas containing a borazine ring skeleton may include, for example, a gas containing a borazine ring skeleton and an organic ligand, i.e., an organic borazine-based gas.

The organic borazine-based gas may include, for example, a gas obtained by evaporating an alkylborazine compound that is an organic borazine compound. The organic borazine-based gas may be referred to as a borazine compound gas, or a borazine-based gas.

Figure 10A:
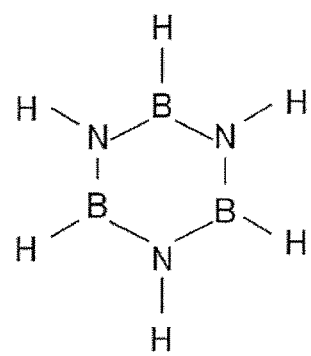
FIGS. 10A to 10D are views showing a chemical structural formula of borazine, a chemical structural formula of a borazine compound, a chemical structural formula of n,n',n"-trimethylborazine, and a chemical structural formula of n,n',n"-tri-n-propylborazine, respectively.
Figure 10B:
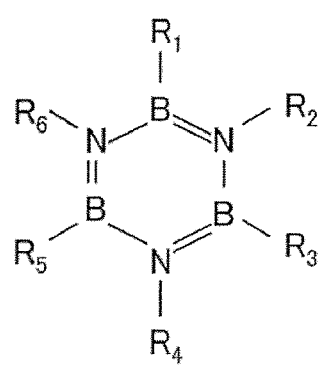

Here, the borazine compound is a heterocyclic compound consisting of three elements of B, N and H, and may be represented by a composition formula of $B_3H_6N_3$ and represented by a chemical structural formula shown in FIG. 10A. The borazine compound is a compound including a borazine ring skeleton (referred to as borazine skeleton) constituting a borazine ring consisting of three boron atoms and three nitrogen atoms. The organic borazine compound is a borazine compound containing C and may be referred to as a borazine compound containing a ligand containing C, i.e., an organic ligand. An alkylborazine compound is a borazine compound containing an alkyl group and may be referred to as a borazine compound containing an alkyl group as an organic ligand. The alkylborazine compound is a compound in which at least any one of six hydrogen atoms contained in the borazine is substituted with a hydrocarbon containing one or more carbon atoms, and may be represented by the chemical structural formula shown in FIG. 10B. Here, $R_1$ to $R_6$ in the chemical structural formula shown in FIG. 10B are H or an alkyl group containing one to four carbon atoms. $R_1$ to $R_6$ may be the same alkyl group or different alkyl groups from each other. However, $R_1$ to $R_6$ cannot all be H. The alkylborazine compound may be referred to as a substance having a borazine ring skeleton constituting a borazine ring and containing B, N, H and C. The alkylborazine compound may also be referred to as a substance having a borazine ring skeleton and containing an alkyl ligand. In addition, $R_1$ to $R_6$ may be H, or an alkenyl group or alkynyl group containing one to four carbon atoms. $R_1$ to $R_6$ may be the same alkenyl group or alkynyl group, or different alkenyl groups or alkynyl groups from each other. However, $R_1$ to $R_6$ cannot all be H.

The borazine-based gas functions as a B source, an N source, and also a C source in the film forming process described later.

Figure 10C:
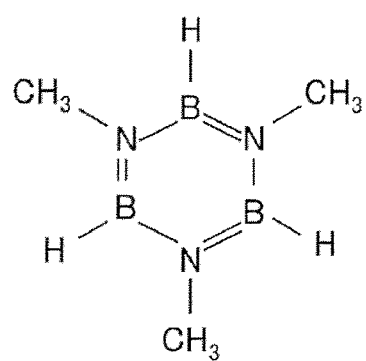
Figure 10D:
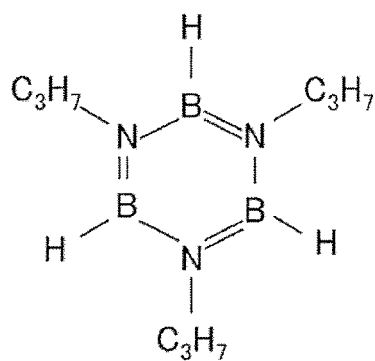

The borazine-based gas may include, for example, n,n',n"-trimethylborazine (abbreviation: TMB) gas, n,n',n"-triethylborazine (abbreviation: TEB) gas, n,n',n"-tri-n-propylborazine (abbreviation: TPB) gas, n,n',n"-triisopropylborazine (abbreviation: TIPB) gas, n,n',n"-tri-n-butylborazine (abbreviation: TBB) gas, n,n',n"-triisobutylborazine (abbreviation: TIBB) gas or the like. TMB is a borazine compound, which is represented by the chemical structural formula shown in FIG. 10B wherein $R_1$, $R_3$, and $R_5$ are H and $R_2$, $R_4$, and $R_6$ are a methyl group and may be represented by a chemical structural formula shown in FIG. 10C. TEB is a borazine compound that is represented by the chemical structural formula shown in FIG. 10B wherein $R_1$, $R_3$, and $R_5$ are H and $R_2$, $R_4$, and $R_6$ are an ethyl group. TPB is a borazine compound, which is represented by the chemical structural formula shown in FIG. 10B wherein $R_1$, $R_3$, and $R_5$ are H and $R_2$, $R_4$, and $R_6$ are a propyl group and may be represented by a chemical structural formula shown in FIG. 10D. TIPB is a borazine compound that is represented by the chemical structural formula shown in FIG. 10B wherein $R_1$, $R_3$, and $R_5$ are H and $R_2$, $R_4$, and $R_6$ are an isopropyl group. TIBB is a borazine compound that is represented by the chemical structural formula shown in FIG. 10B wherein $R_1$, $R_3$, and $R_5$ are H and $R_2$, $R_4$, and $R_6$ are an isobutyl group.

When a borazine compound in a liquid state at normal temperature under normal pressure, such as the TMB, is used, the borazine compound in a liquid state is vaporized by a vaporization system, such as a vaporizer or a bubbler, and supplied as a borazine-based gas (TMB gas or the like).

As a reaction gas containing elements (second to fourth elements) different from the above-described first element, a carbon-containing (C-containing) gas, for example, may be supplied from the gas supply pipe 232b into the process chamber 201 through the MFC 241b, the valve 243b, the RPU 244b, and the gas supply port 210b. The C-containing gas may include, for example, a hydrocarbon-based gas. The hydrocarbon-based gas may be referred to as a substance consisting of only two elements of C and H and functions as a C source in the film forming process described later. The hydrocarbon-based gas may include, for example, propylene ($C_3H_6$) gas.

As an inert gas, nitrogen ($N_2$) gas, for example, may be supplied from the gas supply pipes 232c and 232d into the process chamber 201 through the MFCs 241c and 241d, the valves 243c and 243d, the gas supply pipes 232a and 232b, the gas supply ports 210a and 210b, and the shower head 240, respectively. The inert gas supplied from the gas supply pipes 232c and 232d functions as a purge gas, a dilution gas, or a carrier gas.

When the precursor gas is supplied from the gas supply pipe 232a, a precursor gas supply system is mainly configured by the gas supply pipe 232a, the MFC 241a, and the valve 243a. The gas supply port 210a and the shower head 240 may also be included in the precursor gas supply system. The precursor gas supply system may be referred to as a precursor supply system. When the halosilane precursor gas is supplied from the gas supply pipe 232a, the precursor gas supply system may be referred to as a halosilane precursor gas supply system, or a halosilane precursor supply system.

When the modifying gas is supplied from the gas supply pipe 232a, a modifying gas supply system is mainly configured by the gas supply pipe 232a, the MFC 241a, and the valve 243a. The gas supply port 210a and the shower head 240 may also be included in the modifying gas supply system.

When the cleaning gas is supplied from the gas supply pipe 232a, a cleaning gas supply system is mainly configured by the gas supply pipe 232a, the MFC 241a, and the valve 243a. The gas supply port 210a and the shower head 240 may also be included in the cleaning gas supply system. The cleaning gas supply system may be referred to as a fluorine-containing (F-containing) gas supply system, an etching gas supply system, or an etchant supply system.

When the heating promotion gas is supplied from the gas supply pipe 232a, a heating promotion gas supply system is mainly configured by the gas supply pipe 232a, the MFC 241a, and the valve 243a. The gas supply port 210a and the shower head 240 may also be included in the heating promotion gas supply system. The heating promotion gas supply system may be referred to as a heat conductive gas supply system.

When the O-containing gas is supplied from the gas supply pipe 232b, an O-containing gas supply system is mainly configured by the gas supply pipe 232b, the MFC 241b, and the valve 243b. The RPU 244b and the gas supply port 210b may be included in the O-containing gas supply system. The O-containing gas supply system may be referred to as an oxidizing gas supply system, or an oxidizing agent supply system.

When the N-containing gas is supplied from the gas supply pipe 232b, an N-containing gas supply system is mainly configured by the gas supply pipe 232b, the MFC 241b, and the valve 243b. The RPU 244b and the gas supply port 210b may be included in the N-containing gas supply system. The N-containing gas supply system may be referred to as a nitriding gas supply system, or a nitriding agent supply system. When the hydronitrogen-based gas is supplied from the gas supply pipe 232b, the N-containing gas supply system may be referred to as a hydronitrogen-based gas supply system, or a halosilane supply system.

When the gas containing N and C is supplied from the gas supply pipe 232b, an N and C-containing gas supply system is mainly configured by the gas supply pipe 232b, the MFC 241b, and the valve 243b. The RPU 244b and the gas supply port 210b may be included in the N and C-containing gas supply system. When the amine-based gas is supplied from the gas supply pipe 232b, the N and C-containing gas supply system may be referred to as an amine-based gas supply system, or an amine supply system. Since the gas containing N and C is an N-containing gas and also a C-containing gas, the N and C-containing gas supply system may be included in the N-containing gas supply system or a C-containing gas supply system described later.

When the B-containing gas is supplied from the gas supply pipe 232b, a B-containing gas supply system is mainly configured by the gas supply pipe 232b, the MFC 241b, and the valve 243b. The RPU 244b and the gas supply port 210b may be included in the B-containing gas supply system. When the borane-based gas is supplied from the gas supply pipe 232b, the B-containing gas supply system may be referred to as a borane-based gas supply system, or a borane compound supply system. When the borazine-based gas is supplied from the gas supply pipe 232b, the B-containing gas supply system may be referred to as a borazine-based gas supply system, or a borazine compound supply system.

When the C-containing gas is supplied from the gas supply pipe 232b, a C-containing gas supply system is mainly configured by the gas supply pipe 232b, the MFC 241b, and the valve 243b. The RPU 244b and the gas supply port 210b may be included in the C-containing gas supply system. When the hydrocarbon-based gas is supplied from the gas supply pipe 232b, the C-containing gas supply system may be referred to as a hydrocarbon-based gas supply system, or a hydrocarbon supply system.

Among the various gases supplied from the above-described gas supply systems, any one or all of the gases used in the later-described film forming process may be referred to as a film forming gas, or a processing gas. In addition, among the above-described gas supply systems, any one or all of the gas supply systems used in the later-described film forming process may be referred to as a film forming gas supply system, or a processing gas supply system. Further, among the above-described gas supply systems, any one or all of the gas supply systems for supplying a reaction gas may be referred to as a reaction gas supply system, or a reactant supply system.

Furthermore, among the above-described gas supply systems, any one or all of later-described gas supply systems used in a modification process of deposit and a cleaning process may be referred to as a reactive gas supply system.

In addition, an inert gas supply system is mainly configured by the gas supply pipes 232c and 232d, the MFCs 241c and 241d, and the valves 243c and 243d. The inert gas supply system may be referred to as a purge gas supply system, a dilution gas supply system, or a carrier gas supply system.

Figure 3:
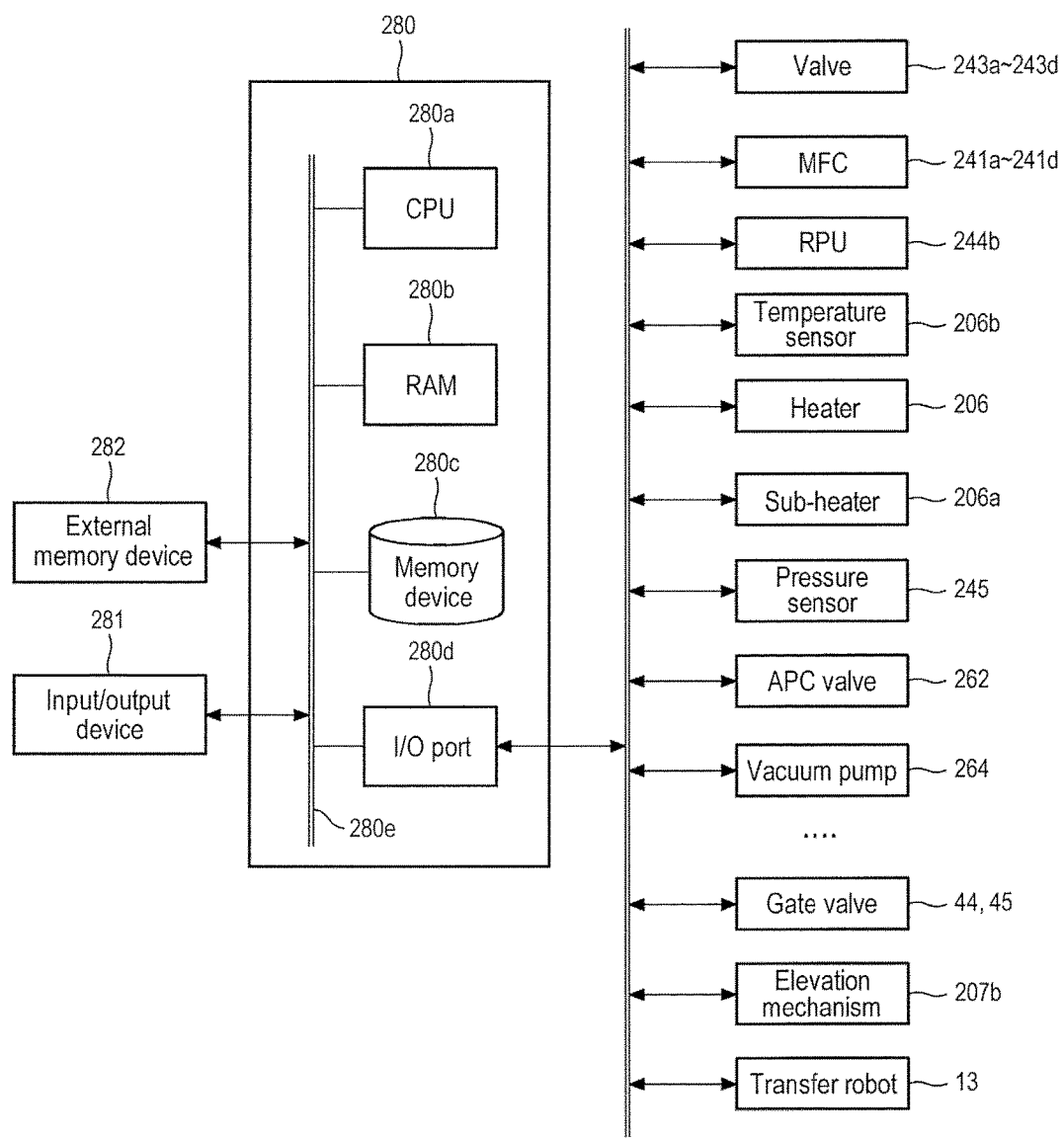
FIG. 3 is a schematic view of a configuration of a controller of the substrate processing apparatus appropriately used in one embodiment of the present disclosure, showing a control system of the controller in a block diagram.

As illustrated in FIG. 3, a controller 280, which is a control part (control means), is configured as a computer including a central processing unit (CPU) 280a, a random access memory (RAM) 280b, a memory device 280c, and an I/O port 280d. The RAM 280b, the memory device 280c and the I/O port 280d are configured to exchange data with the CPU 280a via an internal bus 280e. An input/output device 281, for example, including a touch panel or the like, is connected to the controller 280.

The memory device 280c is configured by, for example, a flash memory, a hard disc drive (HDD), or the like. Control programs for controlling operations of the substrate processing apparatus or a variety of recipes (a film forming recipe, a modifying recipe, and a cleaning recipe), in which sequences or conditions for the film forming process, the modification process of deposit, and the cleaning process described later are written, are readably stored in the memory device 280c. These recipes function as programs for the controller 280 to execute the respective sequences in the film forming process, the modification process of deposit, and the cleaning process, which will be described later, to obtain a predetermined result. Hereinafter, these recipes or control programs may be generally referred to as "a program." When the term "program" is used herein, it may include the case in which only the recipe is included, the case in which only the control program is included, or the case in which both the process recipe and the control program are included. The RAM 280b is configured as a memory area (work area) in which a program or data read by the CPU 280a is temporarily stored.

The I/O port 280d is connected to the MFCs 241a to 241d, the valves 243a to 243d, the RPU 244b, the temperature sensor 206b, the heater 206, the sub-heater 206a, the pressure sensor 265, the APC valve 262, the vacuum pump 264, the gate valves 44 and 45, the elevation mechanism 207b, the transfer robot 13 and the like.

The CPU 280a is configured to read and execute the control program from the memory device 280c, while according to an input of an operation command from the input/output device 281, the CPU 280a reads the process recipe from the memory device 280c. The CPU 280a is configured to control the flow rate controlling operation of various types of gases by the MFCs 241a to 241d, the opening/closing operation of the valves 243a to 243d, the plasma generating operation by the RPU 244b, the opening/closing operation of the APC valve 262 and the pressure adjusting operation by the APC valve 262 based on the pressure sensor 265, the operation of starting and stopping the vacuum pump 264, the temperature adjusting operation of the heater 206 based on the temperature sensor 206b, the temperature adjusting operation of the sub-heater 206a, the opening/closing operation of the gate valves 44 and 45, the elevation operation of the elevation mechanism 207b, the moving and loading operation of the transfer robot 13, and the like according to contents of the read recipes.

The controller 280 is not limited to being configured as a dedicated computer but may be configured as a general-purpose computer. For example, the controller 280 according to the embodiment may be configured by preparing an external memory device 282 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 282. However, a means for supplying a program to a computer is not limited to the case in which the program is supplied through the external memory device 282. For example, the program may be supplied using a communication means such as the Internet or a dedicated line, rather than through the external memory device 282. The memory device 280c or the external memory device 282 is configured as a non-transitory computer-readable recording medium. Hereinafter, these means for supplying the program will be simply referred to as a recording medium. When the term "recording medium" is used herein, it may include a case in which only the memory device 280c is included, a case in which only the external memory device 282 is included, or a case in which both the memory device 280c and the external memory device 282 are included.

(2) FILM FORMING PROCESS

An example of a sequence of forming a film on a substrate, which is one of the processes of manufacturing a semiconductor device by using the above-described substrate processing apparatus, will be described with reference to FIG. 4. In the following description, operations of the respective parts constituting the substrate processing apparatus 40 are controlled by the controller 280.

Figure 4:
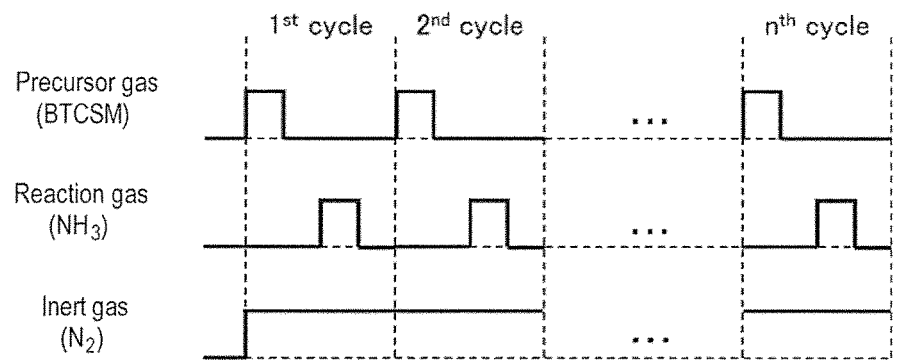
FIG. 4 is a diagram showing timings of supplying gases in a film forming sequence of one embodiment of the present disclosure.

In the film forming sequence shown in FIG. 4, a silicon nitride film (SiN film) containing C, as a film containing Si, C and N, is formed on a wafer 200 as a substrate by performing a cycle a predetermined number of times (once or multiple times), the cycle including: supplying BTCSM gas as the precursor gas to the wafer 200, and supplying $NH_3$ gas as the reaction gas to the wafer 200, which are performed non-simultaneously, i.e., without being synchronized. The SiN film containing C may be referred to as a C-added SiN film (a SiN film doped with C), a C-doped SiN film, a C-containing SiN film, or simply an SiCN film.

Herein, in some cases, the above-described film forming sequence may be represented as follows:

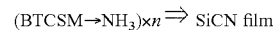

$(BTCSM \rightarrow NH_3) \times n \Rightarrow$ SiCN film

When the term "wafer" is used herein, it may refer to "the wafer itself" or "the wafer and a laminated body (a collected body) of predetermined layers or films formed on the surface of the wafer" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, i.e., the uppermost surface of the wafer, which is a laminated body."

Accordingly, "a predetermined gas is supplied to a wafer" may mean that "a predetermined gas is directly supplied to a surface (an exposed surface) of a wafer itself" or that "a predetermined gas is supplied to a layer or a film formed on a wafer, i.e., on the uppermost surface of a wafer as a laminated body." Also, "a predetermined layer (or film) is formed on a wafer" may mean that "a predetermined layer (or film) is directly formed on a surface (an exposed surface) of a wafer itself" or that "a predetermined layer (or film) is formed on a layer or a film formed on a wafer, i.e., on the uppermost surface of a wafer as a laminated body."

Moreover, the term "substrate" as used herein may be synonymous with the term "wafer," and in this case, the terms "wafer" and "substrate" may be used interchangeably in the above description.

(Wafer Loading and Wafer Mounting)

The mounting table 203 is moved down to the wafer transfer position shown in FIG. 2 by operating the elevation mechanism 207b. Then, the gate valve 44 is opened to allow the process chamber 201 and the transfer chamber 11 to be in communication with each other. The wafer 200 is then transferred from the interior of the transfer chamber 11 into the process chamber 201 by means of the transfer robot 13. The wafer 200 loaded into the process chamber 201 is temporarily mounted on the lift pins 208b that protrude from the upper surface of the mounting table 203. If the transfer arm 13a of the transfer robot 13 is returned to the interior of the transfer chamber 11 from the interior of the process chamber 201, the gate valve 44 is then closed.

The mounting table 203 is moved up to the wafer processing position shown in FIG. 1 by operating the elevation mechanism 207b. As a result, the lift pins 208b are retracted from the upper surface of the mounting table 203, and the wafer 200 is mounted on the susceptor 217 on the upper surface of the mounting table 203.

(Pressure Adjustment and Temperature Adjustment)

The interior of the process chamber 201, i.e., the space in which the wafer 200 is present, is vacuum exhausted (decompression exhausted) by the vacuum pump 264 such that the internal pressure of the process chamber 201 is a predetermined processing pressure (a film forming pressure). At this time, the internal pressure of the process chamber 201 is measured by the pressure sensor 265, and the APC valve 262 is feedback-controlled based on the measured pressure information. The vacuum pump 264 maintains a regular operation state at least until the processing of the wafer 200 is terminated.

Further, the wafer 200 is heated by the heater 206 such that the surface of the wafer 200 reaches a predetermined processing temperature (a film forming temperature). Here, an electrical conduction state to the heater 206 is feedback-controlled based on the temperature information detected by the temperature sensor 206b until the surface of the wafer 200 reaches a desired temperature distribution. The heating of the wafer 200 by the heater 206 is continuously performed at least until the processing of the wafer 200 is terminated.

In addition, the gas supply pipe 232a, the shower head 240, the process vessel 202, the exhaust chamber 260a, the exhaust pipe 261 and the like are heated by the sub-heater 206a to a predetermined temperature (a deposition suppression temperature). The heating by the sub-heater 206a prevents the precursor gas and the like from being adsorbed onto surfaces of these members in the film forming process described later. The heating by the sub-heater 206a is continuously performed at least until the processing of the wafer 200 is terminated. In addition, considering safety and the like, the temperature of the sub-heater 206a may be, for example, several tens to 150 degrees C. or so.

(SiCN Film Formation)

Next, the following two steps, i.e., Steps 1 and 2, are sequentially performed.

[Step 1]

(BTCSM Gas Supply)

In this step, the BTCSM gas is supplied to the wafer 200 in the process chamber 201.

Here, the valve 243a is opened to flow the BTCSMS gas into the gas supply pipe 232a. A flow rate of the BTCSM gas is adjusted by the MFC 241a, and the BTCSM gas is supplied into the process chamber 201 through the gas supply port 210a and the shower head 240, passes through the gap 201a, the exhaust opening 260, and the exhaust chamber 260a, and then is exhausted through the exhaust pipe 26. At this time, the BTCSM gas is supplied to the wafer 200. At the same time, the valve 243c is opened to flow the $N_2$ gas into the gas supply pipe 232c. A flow rate of the $N_2$ gas is adjusted by the MFC 241c, and the $N_2$ gas is supplied into the process chamber 201 together with the BTCSM gas and exhausted through the exhaust pipe 261.

Here, in order to prevent infiltration of the BTCSM gas into the gas supply port 2101), the valve 243d is opened to flow the $N_2$ gas into the gas supply pipe 232d. The $N_2$ gas is supplied into the process chamber 201 through the gas supply pipe 232b and the gas supply port 210b, and exhausted through the exhaust pipe 261.

A supply flow rate of the BTCSM gas controlled by the MFC 241a is set to fall within a range of, for example, 1 to 2,000 sccm, specifically 10 to 1,000 sccm. A supply flow rate of the $N_2$ gas controlled by each of the MFCs 241c and 241d is set to fall within a range of, for example, 100 to 10,000 sccm. The internal pressure of the process chamber 201 is set to fall within a range of, for example, 1 to 4,000 Pa, specifically 1 to 2,666 Pa, more specifically 67 to 1,333 Pa. A time of supplying the BTCSM gas to the wafer 200, i.e., a gas supply time (irradiation time), is set to fall within a range of, for example, 1 to 120 seconds, specifically in a range of 1 to 60 seconds. A temperature of the heater 206 is set such that a temperature of the wafer 200 falls within a range of, for example, 400 degrees C. or more to 800 degrees C. or less, specifically 500 degrees C. or more to 700 degrees C. or less, more specifically 600 degrees C. or more to 700 degrees C. or less.

When the temperature of the wafer 200 is less than 400 degrees C., it becomes difficult for the BTCSM to be chemisorbed onto the wafer 200, such that a practical film forming rate cannot be obtained in some cases. The BTCSM can be chemisorbed onto the wafer 200 by increasing the temperature of the wafer 200 to 400 degrees C. or more, and the film forming rate can be increased. The BTCSM can be sufficiently adsorbed onto the wafer 200 by increasing the temperature of the wafer 200 to 500 degrees C. or more, and a sufficient film forming rate can be obtained. The BTCSM can be more sufficiently adsorbed onto the wafer 200 by increasing the temperature of the wafer 200 to 600 degrees C. or more, or 650 degrees C. or more, and thus, a more sufficient film forming rate can be obtained.

When the temperature of the wafer 200 exceeds 800 degrees C., the film thickness uniformity may be easily deteriorated to make it difficult to control the film thickness uniformity as a CVD reaction is strengthened (i.e., an excessive gaseous reaction is generated). By regulating the temperature of the wafer 200 to 800 degrees C. or less, an appropriate gaseous reaction can be generated, thereby suppressing deterioration of the film thickness uniformity and thus making it possible to control the film thickness uniformity. In particular, a surface reaction becomes more dominant than the gaseous reaction by setting the temperature of the wafer 200 to 700 degrees C. or less, the film thickness uniformity can be easily secured, and thus, it becomes easy to control the film thickness uniformity.

Accordingly, the temperature of the wafer 200 may be set to fall within a range of, for example, 400 degrees C. or more to 800 degrees C. or less, specifically, 500 degrees C. or more to 700 degrees C. or less, more specifically 600 degrees C. or more to 700 degrees C. or less. Since BTCSM gas has a low decomposability (low reactivity) and a high pyrolysis temperature, it is possible to suppress the generation of an excessive gaseous reaction by generating an appropriate gaseous reaction even when a film is formed in a relatively high temperature range, for example, 650 to 800 degrees C., whereby it is possible to suppress the generation of particles.

As the BTCSM gas is supplied to the wafer 200 under the above-described conditions, for example, an Si-containing layer containing C and Cl having a thickness of less than one atomic layer to several atomic layers is formed on the wafer 200 (the base film of the surface). The Si-containing layer containing C and Cl may be a layer having an Si—C bonding. The Si-containing layer containing C and Cl may be an Si layer containing C and Cl, an adsorption layer of the BTCSM, or both of these.

The Si layer containing C and Cl is a generic name including a discontinuous layer in addition to a continuous layer formed of Si and containing C and Cl, or an Si thin film containing C and Cl formed by laminating them. A continuous layer formed of Si and containing C and Cl may be referred to as the Si thin film containing C and Cl. Si constituting the Si layer containing C and Cl includes Si, in which its bonding to C or Cl is completely broken, in addition to Si, in which its bonding to C or Cl is not completely broken.

The adsorption layer of the BTCSM may include an adsorption layer in which molecules of the BTCSM are discontinuous, in addition to an adsorption layer in which the molecules of the BTCSM are continuous. That is, the adsorption layer of the BTCSM may include an adsorption layer containing BTCSM molecules having a thickness of one molecular layer or less. The BTCSM molecule constituting the adsorption layer of the BTCSM also includes a molecule in which bonding of Si and C is partially broken, or a molecule in which bonding of Si and Cl is partially broken. That is, the adsorption layer of the BTCSM includes a chemisorption layer of the BTCSM, a physisorption layer of the BTCSM, or both of these.

Here, a layer having a thickness of less than one atomic layer refers to a discontinuously formed atomic layer, and a layer having a thickness of one atomic layer refers to a continuously formed atomic layer. A layer having a thickness of less than one molecular layer refers to a discontinuously formed molecular layer, and a layer having a thickness of one molecular layer refers to a continuously formed molecular layer. The Si-containing layer containing C and Cl may include both the Si layer containing C and Cl and the adsorption layer of the BTCSM. However, as described above, the Si-containing layer containing C and Cl will be represented as "a one-atomic layer," "a several-atomic layer," or the like.

Under a condition in which the BTCSM gas is self-decomposed (pyrolyzed), i.e., under a condition in which a pyrolysis reaction of the BTCSM gas occurs, the Si layer containing C and Cl is formed by depositing Si on the wafer 200. Under a condition in which the BTCSM gas is not self-decomposed (pyrolyzed) (i.e., under a condition in which a pyrolysis reaction of the BTCSM gas does not occur), the adsorption layer of the BTCSM gas is formed by adsorbing the BTCSM gas onto the wafer 200. Even under either condition, at least some of the Si—C bondings in the BTCSM gas are not broken but remain, and is introduced as they are into the Si-containing layer containing C and Cl (the Si layer containing C and Cl or the adsorption layer of the BTCSM). For example, under a condition in which a pyrolysis reaction of the BTCSM gas occurs, even though one Si—C bonding of the Si—C—Si bonding in the BTCSM gas is broken, the other Si—C bonding is not broken but remains, and introduced as it is into the Si layer containing C and Cl. The formation of the Si layer containing C and Cl on the wafer 200 may be advantageous in that such formation results in a higher film forming rate than the formation of the adsorption layer of BTCSM on the wafer 200.

When the thickness of a first layer formed on the wafer 200 exceeds several atomic layers, an effect of the modification reaction in Step 2 described later is not applied to the entire first layer. In addition, a minimum value of the thickness of the first layer that can be formed on the wafer 200 is less than one atomic layer. Accordingly, the thickness of the first layer may range from less than one atomic layer to several atomic layers. When the thickness of the first layer is one atomic layer or less, i.e., one atomic layer or less than one atomic layer, an effect of a modification reaction in Step 2 described later can be relatively increased, and thus a time required for the modification reaction in Step 2 can be reduced. A time required for forming the first layer in Step 1 can also be reduced. As a result, a processing time per one cycle can be reduced, and a total processing time can also be reduced. That is, the film forming rate can be increased. In addition, as the thickness of the first layer is one atomic layer or less, it may become easier to maintain and control the film thickness uniformity.

(Residual Gas Removal)

After the first layer is formed, the valve 243a is closed to stop the supply of the BTCSM gas. At this time, while the APC valve 262 is in an open state, the interior of the process chamber 201 is vacuum exhausted by the vacuum pump 264 to remove the residual BTCSM gas remaining in the process chamber 201, which does not react or remains after contributing to the formation of the first layer, from the process chamber 201. At this time, the valves 243c and 243d are in an open state, and the supply of the $N_2$ gas into the process chamber 201 is maintained. The $N_2$ gas acts as a purge gas, so that the gas remaining in the process chamber 201 can be more effectively removed from the process chamber 201.

In this case, the gas remaining in the process chamber 201 may not be completely removed, and the interior of the process chamber 201 may not be completely purged. When the gas remaining in the process chamber 201 is very small in amount, there is no adverse effect generated in Step 2 performed thereafter. An amount of the $N_2$ gas supplied into the process chamber 201 need not be a large amount, and for example, approximately the same amount of the $N_2$ gas as the process vessel 202 (the process chamber 201) may be supplied to perform the purge such that there is no adverse effect generated in Step 2. As described above, as the interior of the process chamber 201 is not completely purged, the purge time can be reduced, thereby improving the throughput.

The consumption of the $N_2$ gas can also be suppressed to a minimal necessity.

The precursor gas may be include, for example, BTCSE gas, TCDMDS gas, DCTMDS gas, MCPMDS gas or the like, in addition to the BTCSM gas. The inert gas may include, for example, a rare gas such as Ar gas, He gas, Ne gas, Xe gas, and the like, in addition to the $N_2$ gas.

[Step 2]

($NH_3$ Gas Supply)

After Step 1 is terminated, the $NH_3$ gas which has been thermally activated is supplied to the wafer 200 in the process chamber 201.

In this Step, the opening/closing control of the valves 243b to 243d is performed in the same sequence as the opening/closing control of the valves 243a, 243c and 243d in Step 1. The $NH_3$ gas is supplied into the process chamber 201 through the gas supply pipe 232b and the gas supply port 210b, passes through the gap 201a, the exhaust opening 260, and the exhaust chamber 260a, and then is exhausted through the exhaust pipe 261. At this time, the $NH_3$ gas is supplied to the wafer 200.

A supply flow rate of the $NH_3$ gas controlled by the MFC 241b is set to fall within a range of, for example, 100 to 10,000 sccm. The internal pressure of the process chamber 201 is set to fall within a range of, for example, 1 to 4,000 Pa, specifically 1 to 3,000 Pa. A partial pressure of the $NH_3$ gas in the process chamber 201 is set to fall within a range of, for example, 0.01 to 3,960 Pa. The internal pressure of the process chamber 201 is set to fall within a relatively high pressure range, thereby making it possible to thermally activate the $NH_3$ gas under non-plasma conditions. If the $NH_3$ gas is activated by heat and supplied, a relatively soft reaction can be caused, thereby making it possible to perform the nitriding described later more softly. A time of supplying the $NH_3$ gas, which has been thermally activated, to the wafer 200, i.e., a gas supply time (irradiation time), is set to fall within a range of, for example, 1 to 120 seconds, specifically 1 to 60 seconds. The other processing conditions are set to be the same as the processing conditions of Step 1, for example.

As the $NH_3$ gas is supplied to the wafer 200 under the above-described conditions, at least a portion of the first layer is nitrided (modified). As the first layer is nitrided, a layer containing Si, C and N, i.e., a silicon nitride layer (SiN layer) containing C, as a second layer, is formed on the wafer 200. The SiN layer containing C may be referred to as a C-added SiN layer (a SiN layer doped with C), a C-doped SiN layer, a C-containing SiN layer, or simply an SiCN layer.

When the second layer is formed, at least some of the Si—C bondings included in the first layer is not broken but remains, and is introduced (remained) as it is into the second layer.

The first layer includes a large quantity of strong Si—C bondings, so that the bonding between the atoms constituting the layer is strong to form a stable layer. Accordingly, the supply of the $NH_3$ gas makes it easy to suppress the desorption of C from the first layer. As a result, the second layer includes a large quantity of strong Si—C bondings and thus becomes a stable layer in which the bonding between the atoms constituting the layer is strong. In addition, since a proportion of the strong Si—C bondings included in the layer is great and the bonding between the atoms in the layer is strong, the second layer becomes a layer having a small probability of the desorption of C.

Further, when the second layer is formed, impurities such as Cl contained in the first layer constitute a gaseous substance containing at least Cl, in the process of modification reaction by the $NH_3$ gas, and are discharged from the interior of the process chamber 201. That is, impurities such as Cl in the first layer are extracted or desorbed from the interior of the first layer, thereby being separated from the first layer. Accordingly, the second layer has a small quantity of impurities such as Cl as compared with the first layer.

(Residual Gas Removal)

After the second layer is formed, the valve 243b is closed to stop the supply of the $NH_3$ gas. Then, in the same processing procedure as Step 1, the $NH_3$ gas remaining in the process chamber 201 which does not react or remains after contributing to the formation of the second layer or reaction byproducts are removed from the process chamber 201. At this time, the gas and the like remaining in the process chamber 201 may not be completely removed, which is the same as Step 1.

The N-containing gas (nitriding gas) may include, for example, a hydronitrogen-based gas such as diazene ($N_2H_2$) gas, hydrazine ($N_2H_4$) gas, or $N_3H_8$ gas, a gas containing these compounds, and the like, in addition to the $NH_3$ gas. In addition, the N-containing gas may include, for example, an amine-based gas such as TEA gas or diethylamine (($C_2H_5$)$_2$NH, abbreviation: DEA) gas.

The inert gas may include, for example, a rare gas such as Ar gas, He gas, Ne gas, Xe gas, and the like, in addition to the $N_2$ gas.

(Performing Predetermined Number of Times)

As a cycle in which the above-described Steps 1 and 2 are non-simultaneously performed is performed once or multiple times (a predetermined number of times), an SiCN film having a predetermined composition and a predetermined film thickness may be formed on the wafer 200.

The above-described cycle may be repeated multiple times. That is, a thickness of the SiCN layer formed per cycle may be set to be smaller than a desired film thickness and the above-described cycle may be repeated multiple times until the desired film thickness is obtained.

(Purge and Return to Atmospheric Pressure)

After the formation of the SiCN film is completed, the valves 243c and 243d are opened to supply the $N_2$ gas into the process chamber 201 from the respective gas supply pipes 232c and 232d, and the $N_2$ gas is exhausted through the exhaust pipe 261. The $N_2$ gas acts as a purge gas. Accordingly, the interior of the process chamber 201 is purged, so that the gas remaining in the process chamber 201 or reaction byproducts are removed from the process chamber 201. Thereafter, an atmosphere in the process chamber 201 is substituted with the inert gas.

(Wafer Unloading)

Thereafter, in an order reverse to the order of the above-described wafer loading and wafer mounting step, the wafer 200 on which the SiCN film has been formed is unloaded from the interior of the process chamber 201 and transferred into the transfer chamber 11. Then, until the temperature of the wafer 200 reaches room temperature, the processed wafer 200 is maintained in a cooling chamber, the load lock chamber 21 or the like which is adjacent to the transfer chamber 11. An atmosphere in the transfer chamber 11, the cooling chamber, or the load lock chamber 21 may be set to, for example, a pressure atmosphere below atmospheric pressure and an inert gas atmosphere such as $N_2$ gas, in order to suppress oxidation of the formed SiCN film.

(3) MODIFICATION PROCESS OF DEPOSIT

If the above-described film forming process is performed, deposits including a thin film such as the SiCN film are accumulated on surfaces and the like of members in the process chamber 201. That is, the deposits including the thin film are accumulated on surfaces and the like of members in the process chamber 201. In addition, a relatively large quantity of the deposits are accumulated in a region between the shower head 240 and the mounting table 203 disposed in the wafer processing position. Specifically, a relatively large quantity of the deposits are accumulated on the surface of the mounting table 203 (the surface of the susceptor 217), the surface of the rectifying plate 204, the upper inner wall of the process vessel 202, the surface of the shower head 240 (the lower surface of the shower plate 240b), the interior of the shower head 240, and the like. Since the deposit is a substance containing C, N, Cl, H and the like, the deposit is soft and easily peels. In addition, if a C concentration in the deposit is increased, a stress applied to the deposit is increased, causing the deposit to easily peel and fall. Due to this, the deposit becomes one of the factors for causing the generation of particles in the process chamber 201.

Accordingly, in this embodiment, the modification process of deposit is performed at the earlier of the following: before the quantity (thickness) of the deposit accumulated on the surfaces of the members in the process chamber 201 reaches a critical quantity (critical thickness) at which the deposit begins to peel or fall (a first timing) and before the quantity (thickness) of the deposit reaches a critical quantity (critical thickness) at which an effect of the later-described modification process does not influence the entire deposit (a second timing).

In the modification process of deposit, a modifying gas as the reactive gas is supplied into the process chamber 201 in a state where the mounting table 203 is disposed in a modification position (one of second positions) closer to the ceiling portion of the process chamber 201 than the wafer processing position (first position) and the heater 206 is turned on. In addition, the wafer processing position (first position) may be referred to as a first level (first height). The modification position (one of the second positions) may also be referred to as a second level (second height).

Hereinafter, an example of the modification process of deposit performed using $O_2$ gas as the modifying gas will be described mainly with reference to FIGS. 7A and 7C. In the following description, operations of the respective parts constituting the substrate processing apparatus 40 are controlled by the controller 280.

Pressure Adjustment and Temperature Adjustment

After the wafer 200 on which the SiCN film has been formed is unloaded from the interior of the process vessel 202, in a state where the wafer 200 is not supported on the mounting table 203, the gate valve 44 is closed. Thereafter, the interior of the process chamber 201 is vacuum exhausted (decompression exhausted) by the vacuum pump 264 such that the internal pressure of the process chamber 201 is a predetermined processing pressure (modification pressure). Further, the mounting table 203 is heated by the heater 206 such that the surface of the mounting table 203 reaches a predetermined processing temperature (modification temperature). The adjustment of the internal pressure of the process chamber 201 and the heating of the mounting table 203 by the heater 206 is continuously performed at least until the modification process of deposit is terminated. At this time, the adjustment and the heating may be performed while the sub-heater 206a as well as the heater 206 is turned on (operated).

Movement of Mounting Table

The mounting table 203 is moved from the transfer position shown in FIG. 7A to the modification position shown in FIG. 7C by operating the elevation mechanism 207b. The modification position is a position closer to the ceiling portion in the process chamber 201, i.e., a position closer to the shower head 240, than the wafer processing position shown in FIG. 7B, as described above. A distance C between the mounting table 203 disposed in the modification processing position and the shower head 240 is shorter than a distance A between the mounting table 203 disposed in the transfer position and the shower head 240, and also shorter than a distance B between the mounting table 203 disposed in the wafer processing position and the shower head 240 (A>B>C).

As the mounting table 203 heated by the heater 206 is disposed in the modification position, a member installed in the vicinity of the ceiling portion of the process chamber 201 is heated by radiation from the heater 206, secondary radiation from the mounting table 203, heat conduction through the atmosphere in the process chamber 201, and the like. By maintaining a state that the mounting table 203 is disposed in the modification position for a predetermined time, the temperature of the member installed in the vicinity of the ceiling portion of the process chamber 201 becomes higher than the temperature when the mounting table 203 is disposed in the transfer position or the wafer processing position. As a result, a temperature of regions in which deposits relatively easily accumulate, i.e., a temperature of the surface of the mounting table 203 (the surface of the susceptor 217), the surface of the rectifying plate 204, the upper inner wall of the process vessel 202, the surface of the shower head 240 (the lower surface of the shower plate 240b), the interior of the shower head 240, and the like, is increased up to a predetermined temperature at which the modification process described later can proceed (the modification temperature).

Modification of Deposit

Thereafter, the $O_2$ gas that is thermally activated is supplied into the heated process chamber 201.

In this step, the opening/closing control of the valves 243a to 243d is performed in the same sequence as the opening/closing control of the valves 243a to 243d in Step 1 of the above-described film forming process. The $O_2$ gas is supplied into the process chamber 201 through the gas supply pipe 232a, the gas supply port 210a and the shower head 240, passes through the gap 201a, the exhaust opening 260, and the exhaust chamber 260a, and then is exhausted through the exhaust pipe 261. At this time, the $O_2$ gas that is thermally activated is supplied to the deposits accumulated on the interior of the shower head 240, the surface of the shower head 240, the inner wall of the process vessel 202, the surface of the rectifying plate 204, the surface of the mounting table 203, and the like.

A supply flow rate of the $O_2$ gas controlled by the MFC 241a is set to fall within a range of, for example, 100 to 10,000 sccm. The internal pressure of the process chamber 201 is set to fall within a range of for example, 1 to 4,000 Pa, specifically 1 to 3,000 Pa. A partial pressure of the $O_2$ gas in the process chamber 201 is set to fall within a range of for example, 0.01 to 3,960 Pa. The internal pressure of the process chamber 201 is set to fall within a relatively high pressure range, thereby making it possible to thermally activate the $O_2$ gas under non-plasma conditions. A time of supplying the $O_2$ gas, which is thermally activated, into the process chamber 201, i.e., a gas supply time (irradiation time), is set to fall within a range of, for example, 60 to 1,200 seconds, specifically in a range of 120 to 600 seconds. A temperature of the heater 206 is set such that a temperature of the ceiling portion of the process chamber 201 (the shower head 240), which is disposed in the vicinity of the mounting table 203 and heated, falls within a range of, for example, 400 degrees C. or more to 800 degrees C. or less, specifically 500 degrees C. or more to 700 degrees C. or less, more specifically 600 degrees C. or more to 700 degrees C. or less.

If the temperature of the ceiling portion of the process chamber 201 is below 400 degrees C., it is difficult to obtain modification effects of deposits described later. It is possible to sufficiently increase the modification effects of deposits by setting the temperature of the ceiling portion of the process chamber 201 to 400 degrees C. or more. It is possible to more sufficiently increase the modification effects of deposits by setting the temperature of the ceiling portion of the process chamber 201 to 500 degrees C. or more, specifically 600 degrees C. or more.

If the temperature of the ceiling portion of the process chamber 201 exceeds 800 degrees C., the members constituting the ceiling portion of the process chamber 201, i.e., the components of the shower head 240 and the like, may be damaged by heat. In some cases, the mounting table 203, the susceptor 217 and the like may also be damaged by heat.

In addition, a surplus amount of power is supplied to the heater 206 to increase a modification processing cost. Such problems can be solved by setting the temperature of the ceiling portion of the process chamber 201 to 800 degrees C. or less. Such problems can be more surely solved by setting the temperature of the ceiling portion of the process chamber 201 to 700 degrees C. or less.

As $O_2$ gas is supplied into the process chamber 201 under the above-described conditions, the deposits attached onto the surface of the mounting table 203 (the surface of the susceptor 217), the surface of the rectifying plate 204, the upper inner wall of the process vessel 202, the surface of the shower head 240 (the lower surface of the shower plate 240b), the interior of the shower head 240, and the like are modified. Here, C, N, Cl, H and the like are removed from the deposits and discharged as $CO_2$, CO, $N_2O$, $NO_2$, NO, $N_2$, $Cl_2$, HCl, $H_2$ and the like. In addition, bonding electrons of remaining Si in the deposits due to the break of Si—C, Si—N, Si—Cl, and Si—H bondings are connected to O contained in the $O_2$ gas to form an Si—O bonding. In this way, the deposit can be changed into a substance containing a large quantity of Si—O bondings and having low C, N, Cl, and H contents. As weak bondings included in the deposit are substituted with strong Si—O bondings, the deposit is greatly shrunk. The deposit can be converted into a strong substance having a high density due to a strong bonding between atoms constituting the deposit, i.e., a substance that is difficult to peel. In addition, if a C concentration in the deposit is decreased, a stress applied to the deposit is relieved, making it difficult for the deposit to peel and fall.

The modifying gas may include, for example, an O-containing gas such as $N_2O$ gas, NO gas, $NO_2$ gas, $O_3$ gas, $H_2$ gas+$O_2$ gas, $H_2$ gas+$O_3$ gas, $H_2O$, CO gas, or $CO_2$ gas, in addition to the $O_2$ gas. In addition, the modifying gas may also include, for example, an N-containing gas such as $NH_3$ gas, in addition to the O-containing gas. The inert gas may include, for example, a rare gas such as Ar gas, He gas, Ne gas, Xe gas, and the like, in addition to the $N_2$ gas.

Purge and Return to Atmospheric Pressure

After the modification process of deposit is completed, the valve 243a is closed to stop the supply of the $O_2$ gas.

In addition, the mounting table 203 is moved from the modification position to the transfer position by operating the elevation mechanism 207b. Then, by the same processing procedure and processing conditions as the purge and inert gas substitution step in the above-described film forming process, the interior of the process chamber 201 is purged, so that the atmosphere in the process chamber 201 is substituted with the inert gas. Thereafter, the above-described film forming process is performed on a new wafer 200, or the cleaning process described later is performed.

(4) CLEANING PROCESS

When the film forming process and the modification process described above are performed a predetermined number of times, the modified deposits are accumulated on the surface of the mounting table 203 (the surface of the susceptor 217), the surface of the rectifying plate 204, the upper inner wall of the process vessel 202, the surface of the shower head 240 (the lower surface of the shower plate 240b), the interior of the shower head 240 and the like. Although as described above, the modified deposit is more difficult to peel and has strong properties as compared with an unmodified deposit, if its quantity (thickness) exceeds a critical quantity (critical thickness), the modified deposit peels or falls and becomes one of the factors for generating particles in the process chamber 201. Therefore, the cleaning process is performed at a timing before the quantity (thickness) of this modified deposit film reaches the above-described critical quantity (critical thickness) (a third timing).

In the cleaning process, a cleaning gas as the reactive gas is supplied into the process chamber 201 in a state where the mounting table 203 is disposed in a cleaning position (one of the second positions) closer to the ceiling portion of the process chamber 201 than the wafer processing position (first position) and the heater 206 is turned on.

The wafer processing position (first position) may also be referred to as a first level (first height). Also, the cleaning position (one of the second positions) may be referred to as a third level (third height).

Hereinafter, an example of the cleaning process performed using $F_2$ gas as the cleaning gas will be described mainly with reference to FIGS. 7A and 7D. In the following description, operations of the respective parts constituting the substrate processing apparatus 40 are controlled by the controller 280.

Pressure Adjustment and Temperature Adjustment

In the same manner as when the modification process of deposit is performed, in a state where the wafer 200 is not supported on the mounting table 203, the gate valve 44 is closed. Thereafter, in the same processing procedure as the above-described modification process of deposit, the adjustment of the internal pressure of the process chamber 201 and the adjustment of the temperature of the mounting table 203 by the heater 206 is respectively performed.

Movement of Mounting Table

The mounting table 203 is moved from the transfer position shown in FIG. 7A to the cleaning position shown in FIG. 7D by operating the elevation mechanism 207b. The cleaning position is a position closer to the ceiling portion in the process chamber 201, i.e., a position closer to the shower head 240, than the wafer processing position shown in FIG. 7B, in the same manner as the modification position. A distance C' between the mounting table 203 disposed in the cleaning position and the shower head 240 is shorter than the distance A between the mounting table 203 disposed in the transfer position and the shower head 240, and also shorter than the distance B between the mounting table 203 disposed in the wafer processing position and the shower head 240 (A>B>C').

In addition, as described later, when the cleaning temperature is lower than the above-described modification temperature, the cleaning position may be made different from the modification position, thereby being more spaced apart from the ceiling portion of the process chamber 201 than the modification position. In this case, the distance C' between the mounting table 203 disposed in the cleaning position and the shower head 240 is shorter than the above-described distance A, furthermore shorter than the above-described distance B, and also longer than the above-described distance C (A>B>C'>C). By setting the cleaning position to this position, while the output of the heater 206 is not changed, an increase in the temperature of the ceiling portion of the process chamber 201 can be appropriately suppressed. Further, in order to suppress the increase in the temperature of the ceiling portion of the process chamber 201, the output of the heater 206 may be reduced by making the cleaning position equal to the modification position (A>B>C=C').

Etching of Deposit

Thereafter, the $F_2$ gas that is thermally activated is supplied into the heated process chamber 201.

In this step, the opening/closing control of the valves 243a to 243d is performed in the same sequence as the opening/closing control of the valves 243a to 243d in Step 1 of the above-described film forming process. The $F_2$ gas is supplied into the process chamber 201 through the gas supply pipe 232a, the gas supply port 210a and the shower head 240, passes through the gap 201a, the exhaust opening 260, and the exhaust chamber 260a, and then is exhausted through the exhaust pipe 261. At this time, the $F_2$ gas that is thermally activated is supplied to the deposits attached onto the interior of the shower head 240 (the lower surface of the shower plate 240b), the surface of the shower head 240, the upper inner wall of the process vessel 202, the surface of the rectifying plate 204, the surface of the mounting table 203 (the surface of the susceptor 217), and the like.

A supply flow rate of the $F_2$ gas controlled by the MFC 241a is set to fall within orange of for example, 500 to 5,000 sccm. The internal pressure of the process chamber 201 is set to fall within a range of for example, 1,330 to 101,300 Pa, specifically 13,300 to 53,320 Pa. The internal pressure of the process chamber 201 is net to fall within a relatively high pressure range, thereby making it possible to thermally activate the $F_2$ gas under non-plasma conditions. A time of supplying the $F_2$ gas, which is thermally activated, into the process chamber 201, i.e., a gas supply time (irradiation time), is set to fall within a range of for example, 60 to 1,800 seconds, specifically in a range of 120 to 1,200 seconds. A temperature of the heater 206 is set such that a temperature of the ceiling portion of the process chamber 201 (the shower head 240), which is disposed in the vicinity of the mounting table 203 and heated, falls within a range of, for example, 200 degrees C. or more to 400 degrees C. or less, or more specifically 200 degrees C. or more to 350 degrees C.

If the temperature of the ceiling portion of the process chamber 201 is below 200 degrees C., it is difficult to obtain cleaning effects described later. It is possible to sufficiently increase the cleaning effects by setting the temperature of the ceiling portion of the process chamber 201 to 200 degrees C. or more.

If the temperature of the ceiling portion of the process chamber 201 exceeds 400 degrees C., the members constituting the ceiling portion of the process chamber 201, i.e., the components of the shower head 240 and the like, may be damaged by corrosion. In addition, a surplus amount of power is supplied to the heater 206 to increase a cleaning processing cost. Such problems can be solved by setting the temperature of the ceiling portion of the process chamber 201 to 400 degrees C. or less. Such problems can be more surely solved by setting the temperature of the ceiling portion of the process chamber 201 to 350 degrees C. or less.

As $F_2$ gas is supplied into the process chamber 201 under the above-described conditions, the modified deposits attached onto the surface of the mounting table 203 (the surface of the susceptor 217), the surface of the rectifying plate 204, the upper inner wall of the process vessel 202, the surface of the shower head 240 (the lower surface of the shower plate 240b), the interior of the shower head 240, and the like are removed by a thermochemical reaction with the $F_2$ gas. As described above, since the modified deposit with C removed therefrom, the modified deposit has a low etching resistance and thus is easily etched as compared with the unmodified deposit having a large quantity of C. Accordingly, as the $F_2$ gas is supplied to the deposit modified under the above-described conditions, the modified deposit is efficiently removed.

The cleaning gas may include an F-containing gas, such as chlorine fluoride ($ClF_3$) gas, nitrogen fluoride ($NF_3$) gas, hydrogen fluoride (HF) gas, $F_2$ gas+HF gas, $ClF_3$ gas+HF gas, $NF_3$ gas+HF gas, $F_2$ gas+$H_2$ gas, $ClF_3$ gas+$H_2$ gas, or the like $NF_3$ gas+$H_2$ gas, in addition to the $F_2$ gas. The inert gas may include, for example, a rare gas such as Ar gas, He gas, Ne gas, Xe gas, and the like, in addition to the $N_2$ gas.

Purge and Return to Atmospheric Pressure

After the cleaning process is completed, the valve 243a is closed to stop the supply of the $F_2$ gas.

In addition, the mounting table 203 is moved from the cleaning position to the transfer position by operating the elevation mechanism 207b. Then, by the same processing procedure and processing conditions as the purge and inert gas substitution step in the above-described film forming process, the interior of the process chamber 201 is purged, so that the atmosphere in the process chamber 201 is substituted with the inert gas. Thereafter, the above-described film forming process is performed on a new wafer 200.

(5) EFFECTS ACCORDING TO THE EMBODIMENT

According to the embodiment, one or more effects are shown as described below.

(a) As the mounting table 203 heated by the heater 206 is disposed in the modification position when the modification process of deposit is performed, a temperature of regions onto which deposits are relatively easy to be attached, i.e., a temperature of the surface of the mounting table 203 (the surface of the susceptor 217), the surface of the rectifying plate 204, the upper inner wall of the process vessel 202, the surface of the shower head 240 (the lower surface of the shower plate 240b), the interior of the shower head 240, and the like, can be increased up to a temperature at which the modification process can proceed (the modification temperature). With this configuration, the deposits accumulated on the upper inner wall of the process vessel 202, the surface of the shower head 240 (the lower surface of the shower plate 240b), the interior of the shower head 240 and the like, as well as the surface of the mounting table 203 (the susceptor 217) at a position relatively close to the heater 206 or the surface of the rectifying plate 204, can be converted into a strong substance having a high density due to strong bondings between atoms constituting the deposit, i.e., a substance that is difficult to peel. In addition, as a C concentration in the deposit is decreased, a stress applied to the deposit can be relieved and makes it difficult for the deposit to peel and fall. As a result, since the generation of particles due to the peeling deposit can be suppressed, it is possible to improve the quality of the film forming process. Further, the frequency of the cleaning processes is reduced (the period of the cleaning processes extends), making it possible to increase the operation rate of the substrate processing apparatus.

(b) As the mounting table 203 heated by the heater 206 is disposed in the cleaning position when the cleaning process is performed, a temperature of regions onto which deposits are relatively easy to be attached, i.e., a temperature of the surface of the mounting table 203 (the surface of the susceptor 217), the surface of the rectifying plate 204, the upper inner wall of the process vessel 202, the surface of the shower head 240 (the lower surface of the shower plate 240b), the interior of the shower head 240, and the like, can be increased up to a temperature at which the cleaning process can proceed (the cleaning temperature). With this configuration, it is possible to efficiently remove the modified deposits accumulated on the upper inner wall of the process vessel 202, the surface of the shower head 240 (the lower surface of the shower plate 240b), the interior of the shower head 240 and the like, as well as the surface of the mounting table 203 (the susceptor 217) at a position relatively close to the heater 206 or the surface of the rectifying plate 204. As a result, since the generation of particles due to the peeling modified deposit can be suppressed, it is possible to improve the quality of the film forming process.

(c) As described above, the sub-heater 206a is installed for the purpose of suppressing the adsorption of the precursor gas and the like onto the members such as the gas supply pipe 232a, the shower head 240, the process vessel 202, the exhaust chamber 260a, and the exhaust pipe 261, and has only the capability to heat these members, for example, to several tens to 150 degrees C. or so. It is impossible to increase the temperature of the shower head 240 and the like up to the above-described modification temperature or cleaning temperature only by the capability of the sub-heater 206a and thus difficult to perform the modification process or cleaning process using the sub-heater 206a solely. In addition, if the sub-heater 206a has such a function (high power function), a manufacturing cost of the substrate processing apparatus 40 is increased, and further, the safety may be deteriorated. According to this embodiment, without modifying the configuration of the substrate processing apparatus 40 including the sub-heater 206a, the temperature of the shower head 240 and the like can be increased up to the above-described modification temperature or cleaning temperature. For that reason, it is possible to avoid an increase in manufacturing, modification and maintenance costs of the substrate processing apparatus 40. It is also possible to maintain safety.

(d) As the modification process of deposit is performed, a C concentration in the deposit can be reduced and the etching resistance of the deposit can be reduced. As a result, an efficiency or effect of the cleaning process can be increased.

(e) In the modification process of deposit or cleaning process, as the mounting table 203 is moved to the position close to the ceiling portion of the process chamber 201, it is possible to make a substantial volume of the process chamber 201 small. Accordingly, it is easy to increase the internal pressure of the process chamber 201 supplied with the modifying gas or cleaning gas. It is also easy to increase a concentration of the modifying gas or cleaning gas in the process chamber 201. As a result, an efficiency or effect of the modification process of deposit or cleaning process can be increased. It is be possible to reduce a processing cost of the modification process or cleaning process by reducing the used amount of the modifying gas or cleaning gas.

(f) The above-described effects can be obtained in the same manner even when a gas other than the BTCSM gas is used as the precursor gas or a gas other than the $NH_3$ gas is used as the reaction gas. For example, the above-described effects can be obtained even when a C-free gas is used as the precursor gas or the reaction gas and a C-free film such as a silicon nitride film (SiN film) or a silicon oxide film (SiO film) is formed on the wafer 200. That is, the above-described effects can be obtained in the same manner even when C-free deposits are attached onto the interior of the shower head 240 or the process chamber 201. However, the effects of the modification process of deposit or cleaning process is remarkable particularly when C-containing deposits are attached onto the interior of the shower head 240 or the process chamber 201. That is, it may be said that the technical meaning of the modification process of deposit or cleaning process is significant particularly when a C-containing film is formed on the wafer 200.

(g) The above-described effects can be obtained in the same manner even when a gas other than the $O_2$ gas is used as the modifying gas or a gas other than the $F_2$ gas is used as the cleaning gas.

(6) MODIFICATION EXAMPLE

Each process in the embodiment is not limited to the above-described forms and may be modified like the following Modification Examples.

Modification Example 1

In the modification process of deposit, in a state where the heater 206 is turned on, after the mounting table 203 is first disposed in the overshoot position (the third position) which is closer to the ceiling portion in the process chamber 201 than the modification position (the second position), the mounting table 203 may be moved to the modification position.

Figure 8A:
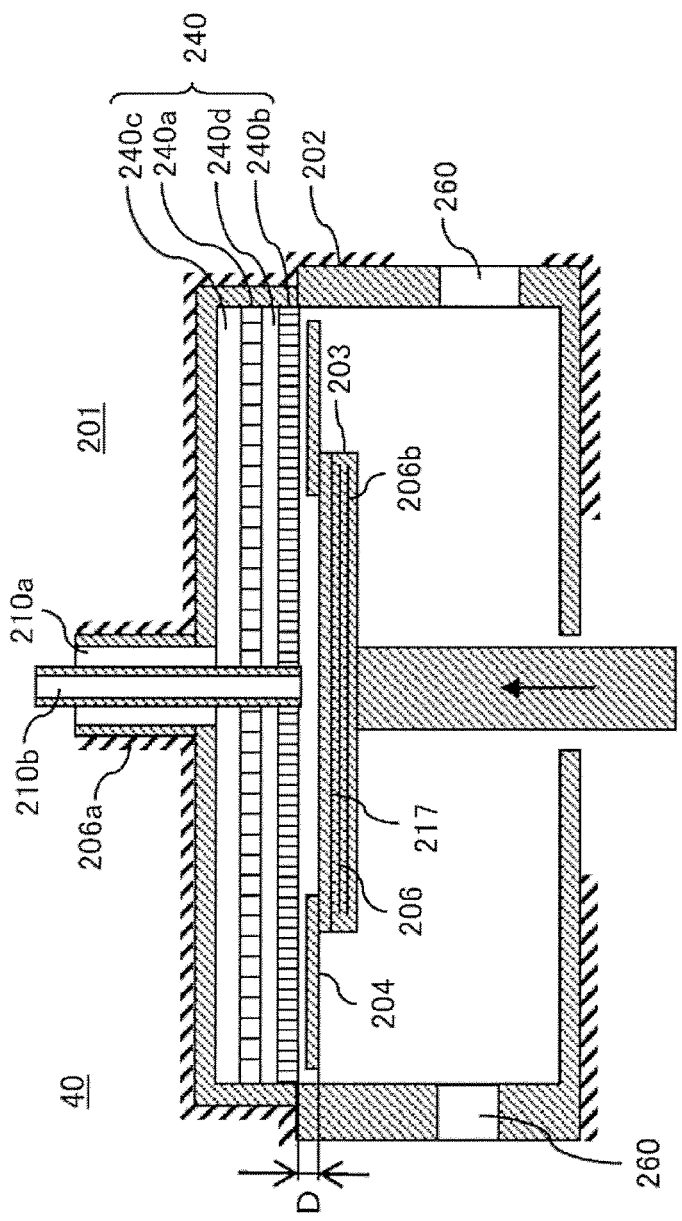
FIG. 8A is a view showing a state of the mounting table moved to an overshoot position.

FIG. 8A is a schematic view showing a state where the mounting table 203 is moved to the overshoot position. As shown in FIG. 8A, a distance D between the mounting table 203 disposed in the overshoot position and the shower head 240 is shorter than the distance C between the mounting table 203 disposed in the modification processing position and the shower head 240 (C>D).

Figure 8B:
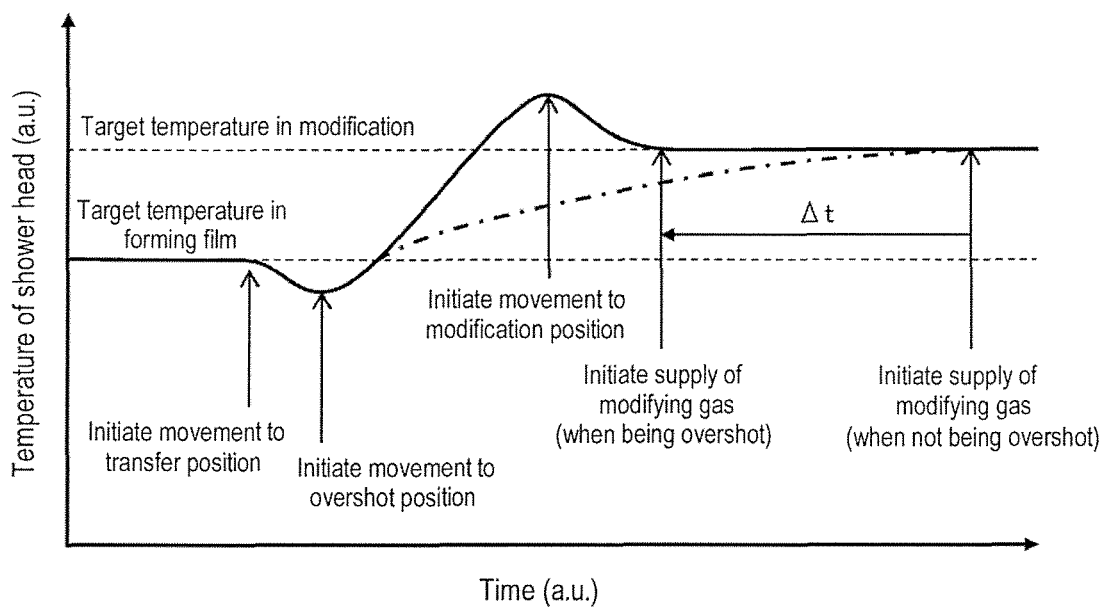
FIG. 8B is a view illustrating a temperature change of a shower head.

FIG. 8B is a view illustrating a temperature change in the shower head 240. The vertical axis of FIG. 8B represents a temperature of the shower head 240, i.e., a temperature of the ceiling portion of the process chamber 201 in arbitrary unit (a.u.). The horizontal axis of FIG. 8B represents an elapse time in arbitrary unit (a.u.). The solid line in FIG. 8B represents a case in which the mounting table 203 is moved from the transfer position to the overshoot position, held in the overshoot position, and then moved to the modification position. The dashed-dotted line in FIG. 8B represents a case in which the mounting table 203 is moved from the transfer position not to the overshoot position but to the modification position and held in the modification position.

Even in this modification example, the same effects as the modification process described above with reference to FIGS. 7A and 7C are obtained. In addition, as shown in FIG. 8B, as the mounting table 203 is first moved to the overshoot position (represented by the solid line), it is possible to rapidly increase the temperature of the ceiling portion of the process chamber 201 or the like, as compared with the case that the mounting table 203 is not moved to the overshoot position (represented by the dashed-dotted line). That is, since the initiation of the supply of the modifying gas can be early by a predetermined time (Δt in the FIG. 8B), it is possible to shorten the overall time required to perform the modification process.

This modification example may be applied to the cleaning process. That is, in the cleaning process, in a state where the heater 206 is turned on, after the mounting table 203 is first disposed in the overshoot position (the third position) which is closer to the ceiling portion in the process chamber 201 than the cleaning position, the mounting table 203 may be moved to the cleaning position. Even in this case, since the temperature of the ceiling portion of the process chamber 201 and the like can be rapidly increased, it is possible to shorten the overall time required to perform the cleaning process.

Modification Example 2

In the modification process of deposit, during the course of the process, in a state where the heater 206 is turned on, the mounting table 203 may be allowed to move between the modification position (the second position) and a fourth position different from the modification position. Here, the fourth position refers to an arbitrary position including the above-described wafer transfer position or a position lower than the wafer transfer position.

Even in this modification example, the same effects as the modification process described above with reference to FIGS. 7A and 7C are obtained. In addition, as the mounting table 203 is moved as described above in a state where the heater 206 is turned on, it is possible to heat a wider area in the process chamber 201, for example, including the bottom portion of the process chamber 201, as well as the ceiling portion of the process chamber 201. As a result, it is possible to perform the modification process of deposit in the wider area in the process chamber 201.

In addition, the mounting table 203 may be moved intermittently (stepwise) or continuously. That is, when the mounting table 203 is moved, a temporary movement and a temporary stop (stay) of the mounting table 203 may be alternately repeated, or the mounting table 203 may be continuously moved without being stopped.

When the mounting table 203 is moved, a moving speed of the mounting table 203 may be appropriately changed according to the position of the mounting table 203. For example, in the vicinity of the ceiling portion of the process chamber 201 where there is a relatively large quantity of deposits, the modification effects of deposit may be improved by decreasing a moving speed of the mounting table 203 (increasing a stay time of the mounting table 203) to promote a temperature rise in members positioned in the vicinity of the mounting table 203 or increase a modification time. In addition, for example, in the vicinity of the bottom portion of the process chamber 201 where there is a relatively small quantity of deposits, the modification effects of deposit may be appropriately suppressed by increasing a moving speed of the mounting table 203 (decreasing a stay time of the mounting table 203) to suppress a temperature rise in members positioned in the vicinity of the mounting table 203 or decrease a modification time.

When the mounting table 203 is intermittently moved, a temporary moving distance, a temporary stopping time or the like of the mounting table 203 may be appropriately changed according to the position of the mounting table 203. For example, in the vicinity of the ceiling portion of the process chamber 201 where there is a relatively large quantity of deposits, the modification effects of deposit may be improved by decreasing a temporary moving distance of the mounting table 203 or increasing a temporary stopping time of the mounting table 203 to promote a temperature rise in members positioned in the vicinity of the mounting table 203 or increase a modification time. In addition, for example, in the vicinity of the bottom portion of the process chamber 201 where there is a relatively small quantity of deposits, the modification effects of deposit may be appropriately suppressed by increasing a temporary moving distance of the mounting table 203 or decreasing a temporary stopping time of the mounting table 203 to suppress a temperature rise in members positioned in the vicinity of the mounting table 203 or decrease a modification time.

This modification example may be applied to the cleaning process. That is, in the cleaning process, in a state where the heater 206 is turned on, the mounting table 203 may be allowed to move between the cleaning position (the second position) and a fourth position different from the cleaning position. Even in this case, since it is possible to heat a wider area in the process chamber 201, it is possible to perform the cleaning process in a wider range in the process chamber 201. Further, at this time, as the moving speed or the like of the mounting table 203 is appropriately changed according to the position of the mounting table 203, it is possible to avoid corrosion of the members in the process chamber 201 and perform the cleaning process in a wider area in the process chamber 201.

Modification Example 3

In the modification process of deposit, before the modifying gas is supplied into the process chamber 201, the step of supplying, for example, $H_2$ gas, as a heating promotion gas having a heat conductivity higher than the modifying gas into the process chamber 201 may be performed.

In this step, the opening/closing control of the valves 243a to 243d is performed in the same sequence as the opening/closing control of the valves 243a to 243d in Step 1 of the above-described film forming process. The $H_2$ gas is supplied into the process chamber 201 through the gas supply pipe 232a, the gas supply port 210a and the shower head 240, passes through the gap 201a, the exhaust opening 260, and the exhaust chamber 260a, and then is exhausted through the exhaust pipe 261. A supply flow rate of the $H_2$ gas controlled by the MFC 241a is set to fall within a range of, for example, 100 to 10,000 sccm. The internal pressure of the process chamber 201 is set to fall within a range of, for example, 1,330 to 101,300 Pa, specifically 13,300 to 53,320 Pa.

Even in this modification example, the same effects as the modification process described above with reference to FIGS. 7A and 7C are obtained. In addition, as the $H_2$ gas having a high heat conductivity is supplied into the process chamber 201, it is possible to increase the efficiency of heat conduction through an atmosphere in the process chamber 201. That is, it is possible to promote the heating of the shower head 240 and the like through the atmosphere in the process chamber 201. As a result, as compared with a case where no $H_2$ gas is supplied into the process chamber 201, since the temperature of the shower head 240 or the like can be rapidly increased, it is possible to initiate the supply of the modifying gas early. That is, it is possible to shorten the overall time required to perform the modification process. In addition to the $H_2$ gas, He gas, a mixture gas of them, or the like, for example, may be appropriately used as the heating promotion gas.

In addition, in this modification example, the heating promotion gas may be substantially sealed in the process chamber 201 by closing the APC valve 262 or setting a degree of the valve opening to be small when the heating promotion gas is supplied into the process chamber 201. As the heating promotion gas is sealed in the process chamber 201, i.e., the process chamber 201 is filled with the heated heating promotion gas, it is possible to further promote the heating of the shower head 240 and the like through the atmosphere in the process chamber 201.

As a result, it is possible to further shorten the overall time required to perform the modification process by initiating the supply of the modifying gas earlier.

This modification example may be applied to the cleaning process. That is, before the cleaning gas is supplied into the process chamber 201, the step of supplying a heating promotion gas having a heat conductivity higher than the cleaning gas into the process chamber 201 may be performed. Even in this case, since the temperature of the shower head 240 and the like can be rapidly increased, it is possible to shorten the overall time required to perform the cleaning process.

Modification Example 4

In the modification process of deposit, the deposit may be modified using an O-containing gas having an oxidizing power stronger than the $O_2$ gas, such as $O_3$ gas, as the modifying gas. Further, the deposit may be modified using moisture-free ($H_2O$-free) oxidizing species, as the modifying gas, such as atomic oxygen (O), which is produced by reacting $H_2$ gas+$O_2$ gas, $H_2$ gas+$O_3$ gas or the like. In addition, a plasma generator like the RPU 244b is installed on the gas supply pipe 232a and the modifying gas is activated into plasma by the plasma generator, so that the gas activated into plasma may be used to modify deposits.

Even in this modification example, the same effects as the modification process described above with reference to FIGS. 7A and 7C are obtained. In addition, it is possible to increase the above-described modification effects more through the high oxidizing power exhibited by these gases. Further, in the case that the $O_3$ gas is used or the modifying gas is used after being activated into plasma, the processing temperature of the modification process (the modification temperature) can also be lowered, for example, to room temperature or so. Furthermore, when the atomic oxygen produced by the reaction of $H_2$ gas+$O_2$ gas is used, a processing temperature of the modification process (the modification temperature) can also be lowered, for example, to 350 degrees C. or so. In these cases, as compared with the case that the thermally activated $O_2$ gas is used as the modifying gas, the modification position may be set to be a position spaced apart from the ceiling portion of the process chamber 201, for example, a position close to the cleaning position, the wafer processing position, or the wafer transfer position.

Modification Example 5

In the cleaning process, the cleaning gas may be allowed to flow not continuously but intermittently in the process chamber 201. For example, a step of supplying a cleaning gas into the process chamber 201 and a step of exhausting the process chamber 201 with the supply of the cleaning gas into the process chamber 201 stopped may be alternately performed a predetermined number of times. Also, in the step of supplying the cleaning gas into the process chamber 201, the cleaning gas may be substantially sealed in the process chamber 201 or the shower head 240 by closing the APC valve 262 or setting a degree of the valve opening to be small.

Even in this modification example, the same effects as the cleaning process described above with reference to FIGS. 7A and 7D are obtained. In addition, a change in pressure within the process chamber 201 or the shower head 240 may be generated by intermittently supplying the cleaning gas, and thus, the impact caused by the change in pressure may be given to the deposits in the process chamber 201. Accordingly, the deposits may be etched while being cracked, peeled off or the like. In addition, it is possible to sufficiently secure a stay time of the cleaning gas in the process chamber 201 or the shower head 240, i.e., a time required for cleaning, by sealing the cleaning gas as described above. It is also possible to fill the entire the process chamber 201 or the shower head 240 with the heated cleaning gas. Accordingly, the cleaning process can be securely performed in the entire process chamber 201 or the shower head 240.

In addition, the sealing of the above-described gas can be applied to the modification process of deposit. That is, in the step of supplying the modifying gas into the process chamber 201, the modifying gas may be substantially sealed in the process chamber 201 or the shower head 240 by closing the APC valve 262 or setting a degree of the valve opening to be small. In this case, it is possible to sufficiently secure a stay time of the modifying gas in the process chamber 201 or the shower head 240, i.e., a time required for modifying deposits. It is also possible to fill the entire process chamber 201 or the shower head 240 with the heated modifying gas. Accordingly, the modification process of deposit can be securely performed in the entire process chamber 201 or the shower head 240.

Modification Examples 6 to 13

Figure 5:
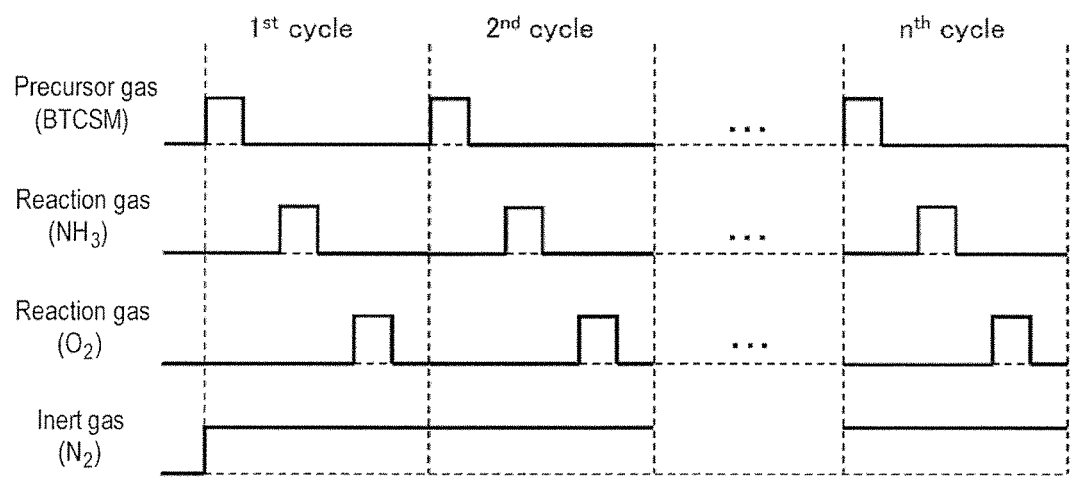
FIG. 5 is a diagram showing timings of supplying gases in Modification Example 6 of the film forming sequence of one embodiment of the present disclosure.

In the film forming process, a silicon oxycarbonitride film (SiOCN film), a silicon oxycarbide film (SiOC film), an SiCN film, a silicon borocarbonitride film (SiBCN film) and the like may be formed on the wafer 200 according to the following film forming sequences. FIG. 5 is a view showing a film forming sequence of Modification Example 6. Even in this modification example, since deposits containing C are attached onto the interior of the shower head 240 or the process chamber 201, the above-described effects caused by performing the modification process of deposit or cleaning process are obtained.

(BTCSM→NH₃→O₂)×n ⇒ SiOCN film    (Modification Example 6)

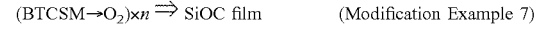
(BTCSM→O₂)×n ⇒ SiOC film    (Modification Example 7)

(BTCSM→BCl₃→NH₃)×n ⇒ SiBCN film    (Modification Example 8)

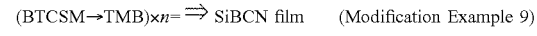
(BTCSM→TMB)×n= ⇒ SiBCN film    (Modification Example 9)

(BTCSM→TMB→NH₃)×n ⇒ SiBCN film    (Modification Example 10)

(HCDS→C₃H₆→NH₃)×n ⇒ SiCN film    (Modification Example 11)

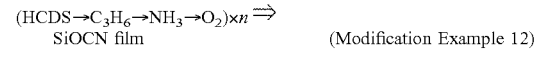
(HCDS→C₃H₆→NH₃→O₂)×n ⇒ SiOCN film    (Modification Example 12)

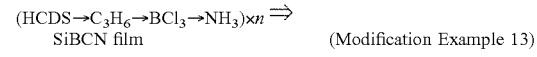
(HCDS→C₃H₆→BCl₃→NH₃)×n ⇒ SiBCN film    (Modification Example 13)

Modification Examples 14 to 18

In the film forming process, a stack film consisting of a first film and a second film alternately stacked at a nano level, i.e., a nano laminate film, may be formed on the wafer 200 according to the following film forming sequences. Hereinafter, the stack film of the first film and the second film is referred to as a "first film/second film." Even in this modification example, since deposits containing C are attached onto the interior of the shower head 240 or the process chamber 201, the above-described effects caused by performing the modification process of deposit or cleaning process are obtained.

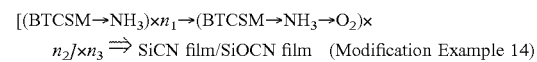
[(BTCSM→NH₃)×n₁→(BTCSM→NH₃→O₂)× n₂]×n₃ ⇒ SiCN film/SiOCN film  (Modification Example 14)

[(BTCSM→NH₃→O₂)×n₁→(BTCSM→O₂)×n₂]× n₃ ⇒ SiOCN film/SiOC film    (Modification Example 15)

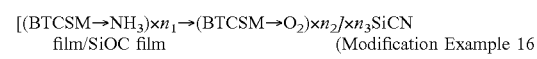
[(BTCSM→NH₃)×n₁→(BTCSM→O₂)×n₂]×n₃SiCN film/SiOC film    (Modification Example 16

[(BTCSM→NH$_3$)×$n_1$→(BTCSM→BCl$_3$→NH$_3$)×$n_2$]
  $n_3$ ⇒ SiCN film/SiBCN film    (Modification Example 17)

[(BTCSM→BCl$_3$→NH$_3$)×$n_1$→(BTCSM→TMB)×
  $n_2$]×$n_3$ ⇒ SiBCN film/SiBCN film (Modification Example 18)

Modification Example 19

In the film forming sequence shown in FIG. 4 or the above-described respective modification examples, the C-containing gas such as C$_3$H$_6$ gas may be supplied simultaneously with the precursor gas such as BTCSM gas or HCDS gas, or the reaction gas such as NH$_3$ gas, O$_2$ gas, TEA gas, BCl$_3$ gas, or TMB gas. That is, the step of supplying the C$_3$H$_6$ gas may be performed simultaneously with any one of the step of supplying the precursor gas and the step of supplying the reaction gas other than the C$_3$H$_6$ gas.

Even in this modification example, since deposits containing C are attached onto the interior of the shower head 240 or the process chamber 201, the above-described effects caused by performing the modification process of deposit or cleaning process are obtained. In addition, it is sometimes advantageous not to supply the C$_3$H$_6$ gas simultaneously with BTCSM gas or HCDS gas but simultaneously with NH$_3$ gas, TEA gas, O$_2$ gas, BCl$_3$ gas, or TMB gas, in that an excessive gaseous reaction in the process chamber 201 can be avoided and the deposited quantity of deposit can be reduced to suppress the generation of particles. Further, it is sometimes advantageous not to supply the C$_3$H$_6$ gas simultaneously with NH$_3$ gas, O$_2$ gas, BCl$_3$ gas or the like but simultaneously with TMB gas, TEA gas or the like, in that the controllability of a composition ratio of the formed film can be increased.

Modification Example 20

In the film forming sequence shown in FIG. 4 or the above-described respective modification examples, the reaction gas such as NH$_3$ gas or O$_2$ gas may be plasma-activated (excited into a plasma state) and then supplied. In this case, when the reaction gas is supplied into the process chamber 201 through the gas supply pipe 232$b$ and the gas supply port 210$b$, the reaction gas has only to be plasma-excited by supplying high frequency power (RF power) to the RPU 244$b$ and operating the RPU 244$b$.

Modification Example 21

When plural types of reaction gases are used in the film forming process, the supply order of these gases is not limited to the order represented in the above-described film forming sequence and can be changed arbitrarily. In addition, when plural types of reaction gases are used in the film forming process, the plural types of reaction gases may be simultaneously supplied to the wafer 200 in any combination. Further, when the film forming process is performed, the precursor gas may be supplied after the supply of the reaction gas by changing the supply order of the precursor gas and the reaction gas. Furthermore, when the film forming process is performed, the precursor gas and the reaction gas may be simultaneously supplied to the wafer 200.
(Processing Condition)

In the modification examples of the above-described film forming sequence, in the step of supplying O$_2$ gas to the wafer 200, a supply flow rate of the O$_2$ gas controlled by the MFC 241$b$ is set to fall within a range of, for example, 100 to 10,000 sccm. The other processing conditions are set to be the same as the processing conditions of Step 2 of the film forming sequence shown in FIG. 4, for example. The O-containing gas may include, for example, N$_2$O gas, NO gas, NO$_2$ gas, O$_3$ gas, H$_2$ gas+O$_2$ gas, H$_2$ gas+O$_3$ gas, H$_2$O, CO gas, CO$_2$ gas and the like, in addition to the O$_2$ gas.

In addition, in the step of supplying BCl$_3$ gas to the wafer 200, a supply flow rate of the BCl$_3$ gas controlled by the MFC 241$b$ is set to fall within a range of, for example, 100 to 10,000 sccm. The other processing conditions are set to be the same as the processing conditions of Step 1 of the film forming sequence shown in FIG. 4, for example. The B-containing gas may include monochloroborane (BClH$_2$) gas, dichloroborane (BCl$_2$H) gas, trifluoroborane (BF$_3$) gas, tribromoborane (BBr$_3$) gas, diborane (B$_2$H$_6$) gas and the like, in addition to the BCl$_3$ gas.

In addition, in the step of supplying TMB gas to the wafer 200, a supply flow rate of the TMB gas controlled by the MFC 241$b$ is set to fall within a range of, for example, 1 to 1,000 sccm. The other processing conditions are set to be the same as the processing conditions of Step 1 of the film forming sequence shown in FIG. 4, for example. The B-containing gas containing a borazine ring skeleton may include, for example, TEB gas, TPB gas, TIPB gas, TBB gas, TIBB gas and the like, in addition to the TMB gas.

In addition, in the step of supplying C$_3$H$_6$ gas to the wafer 200, a supply flow rate of the C$_3$H$_6$ gas controlled by the MFC 241$b$ is set to fall within a range of, for example, 100 to 10,000 sccm. The other processing conditions are set to be the same as the processing conditions of Step 2 of the film forming sequence shown in FIG. 4, for example. The C-containing gas may include, for example, a hydrocarbon-based gas, such as acetylene (C$_2$H$_2$) gas, ethylene (C$_2$H$_4$) gas, in addition to the C$_3$H$_6$ gas.

Also, in the step of plasma activating (plasma exciting) and supplying the reaction gas, such as NH$_3$ gas or O$_2$ gas, to the wafer 200, a supply flow rate of the reaction gas controlled by the MFC 241$b$ is set to fall within a range of, for example, 100 to 10,000 sccm. The RF power supplied to the RPU 244$b$ is set to fall within a range of for example, 50 to 1,000 W. The internal pressure of the process chamber 201 is set to fall within a range of, for example, 1 to 500 Pa, specifically 1 to 100 Pa. A partial pressure of the reaction gas in the process chamber 201 is set to fall within a range of, for example, 0.01 to 495 Pa, specifically 0.01 to 99 Pa. As plasma is used, even if the internal pressure of the process chamber 201 is set to fall within a relatively low pressure range, it is possible to activate the reaction gas. The other processing conditions are set to be the same as the processing conditions of Step 2 of the film forming sequence shown in FIG. 4, for example.

The processing procedures and processing conditions in the other steps may be set to be the same as the processing procedures and processing conditions of the respective steps in the film forming sequence shown in FIG. 4.

Additional Embodiments of Present Disclosure

Hereinabove, various embodiments of the present disclosure has been specifically described, but the present disclosure is not limited to the above-described embodiments and may be variously modified without departing from the spirit of the present disclosure.

In the above-described embodiments, while an example in which the precursor gas is supplied into the process chamber 201 through the shower head 240 and the reaction gas is supplied into the process chamber 201 without passing through the shower head 240 has been described, the present disclosure is not limited thereto. For example, the reaction gas may be supplied into the process chamber 201 through the shower head 240 and the precursor gas may be supplied into the process chamber 201 without passing through the shower head 240. In addition, for example, the precursor gas and the reaction gas each may be supplied into the process chamber 201 through the shower head 240.

In the above-described embodiments, while an example in which the modifying gas, the cleaning gas and the heat conductive gas each are supplied into the process chamber 201 through the shower head 240 has been described, the present disclosure is not limited thereto. For example, any one of the modifying gas, the cleaning gas and the heat conductive gas may be supplied into the process chamber 201 without passing through the shower head 240. However, in order to securely perform the modification process of deposit or the cleaning process in the shower head 240, these gases may be supplied into the process chamber 201 through the shower head 240.

In the above-described embodiments, while an example in which the cleaning process is performed with the wafer 200 not mounted on the mounting table 203 (the susceptor 217) has been described, the present disclosure is not limited thereto. For example, the cleaning process may be performed with a dummy wafer or a protective cover mounted on the susceptor 217. In this case, it is possible to appropriately protect the surface of the susceptor 217 in the cleaning process.

The modification process of deposit may be performed every time after the film forming process is performed once or every time after the film forming process is performed multiple times, for example, several times. In addition, the cleaning process may be performed every time after the modification process of deposit is performed once or every time after the modification process of deposit is performed multiple times, for example, several times. In addition, the cleaning process may be performed without previously performing the modification process of deposit. That is, these processes have only to be performed at any one of the following exemplified timings. However, the cleaning process may be performed after the modification process of deposit is performed, i.e., the cleaning process may be performed after decreasing the etching resistance of deposit, in that the cleaning process can be efficiently performed.

(Film Forming Process)→(Modification Process of Deposit)→(Cleaning Process)

(Film Forming Process)×$n$→(Modification Process of Deposit)→(Cleaning Process)

[(Film Forming Process)→(Modification Process of Deposit)]×$n$→(Cleaning Process)

[(Film Forming Process)×$n_1$→(Modification Process of Deposit)]×$n_2$→(Cleaning Process)

(Film Forming Process)→(Cleaning Process)

(Film Forming Process)×$n$→(Cleaning Process)

In any case, the modification process of deposit may be performed at one of the following timings, whichever occurs first: a timing before reaching a critical quantity (critical thickness) at which the deposit begins to peel or fall and a timing before reaching a critical quantity (critical thickness) at which the effects of the modification process do not influence the entire deposit. Also, in any case, the cleaning process may be performed at the timing before reaching the critical quantity (critical thickness) at which the deposit begins to peel or fall.

In addition, for example, the modification process of deposit or the cleaning process may be appropriately performed after forming on a wafer a metal-based thin film that contains a metal element such as titanium (Ti), zirconium (Zr), hafnium (Hf), tantalum (Ta), niobium (Nb), aluminum (Al), molybdenum (Mo), or tungsten (W). In addition, the modification process of deposit or the cleaning process may be appropriately performed after forming a metal-based nano laminate film consisting of these metal-based thin films alternately stacked at a nano level.

When a metal-based thin film is formed, for example, an inorganic metal gas containing a metal element and a halogen element, such as titanium tetrachloride ($TiCl_4$) gas, titanium tetrafluoride ($TiF_4$) gas, zirconium tetrachloride ($ZrCl_4$) gas, zirconium tetrafluoride ($ZrF_4$) gas, hafnium tetrachloride ($HfCl_4$) gas, hafnium tetrafluoride ($HfF_4$) gas, tantalum pentachloride ($TaCl_5$) gas, tantalum pentafluoride ($TaF_5$) gas, niobium pentachloride ($NbCl_5$) gas, niobium pentafluoride ($NbF_5$) gas, aluminum trichloride ($AlCl_3$) gas, aluminum trifluoride ($AlF_3$) gas, molybdenum pentachloride ($MoCl_5$) gas, molybdenum pentafluoride ($MoF_5$) gas, tungsten hexachloride ($WCl_6$) gas, or tungsten hexafluoride ($WF_6$) gas, may be used as the precursor gas. In addition, the precursor gas may include, for example, an organic metal gas containing a metal element and carbon, such as trimethylaluminum ($Al(CH_3)_3$, abbreviation: TMA) gas. As the reaction gas, the modifying gas, the cleaning gas, and the heating promotion gas, the same gases as in the above-described embodiments may be used.

For example, according to the following film forming sequences, a metal carbide film such as a tantalum carbonitride film (TaCN film), a tantalum aluminide carbide film (TaAlC film), a titanium carbonitride film (TiCN film), or a titanium aluminide carbide film (TiAlC film) may be formed on a wafer. FIG. 6 is a view showing a film forming sequence when a TaAlC film is formed on a wafer.

The processing procedures and processing conditions in the respective steps of these film forming sequences may be set to be the same, for example, as the processing procedures and processing conditions of the above-described embodiments.

($TaCl_5$→$C_3H_6$→$NH_3$)×$n$ ⇒ TaCN film ($TaCl_5$→TMA)×$n$ ⇒ TaAlC film ($TiCl_4$→$C_3H_6$→$NH_3$)×$n$ ⇒ TiCN film ($TiCl_4$→TMA)×$n$ ⇒ TiAlC film Since deposits are attached onto the interior of the shower head 240 or process chamber 201 even when these metal-based thin films are formed, the above-described effects caused by performing the modification process of deposit or cleaning process can be obtained. That is, the present disclosure may be appropriately applied to a case in which a thin film containing a predetermined element, such as a semiconductor element or a metal element, as a first element, and nonmetal elements, such as C, N, O, and B, as second to fourth elements.

A film forming recipe used in forming these various thin films (a program with processing procedures or processing conditions of the film forming process written), a modification recipe used in modifying deposits including these various thin films (a program with processing procedures or processing conditions of the modification process written), or a cleaning recipe used in removing the deposits including these various thin films (a program with processing procedures or processing conditions of the cleaning process written) may be individually prepared according to various processing types (the type of film to be formed, modified and removed, a composition ratio, a film quality, a film thickness, and the like). In addition, when the various processes are initiated, a suitable recipe may be appropriately selected among the plurality of recipes according to a processing type. Specifically, the plurality of recipes individually prepared according to processing types may be previously stored (installed) in the memory device 280c provided in the substrate processing apparatus through an electrical communication line or a recording medium (e.g., the external memory device 282) in which the recipes are recorded. In addition, when a process is initiated, the CPU 280a provided in the substrate processing apparatus may appropriately select a suitable recipe among the plurality of recipes stored in the memory device 280c according to a processing type. With this configuration, thin films having a variety of film types, composition ratios, film qualities and film thicknesses can be formed, modified and removed with high versatility and high reproducibility in one substrate processing apparatus. In addition, since an operator's work load (a load of inputting processing procedures or processing conditions, or the like) can be reduced, it is possible to rapidly initiate various processes while avoiding an operational error.

The above-described process recipe, modification recipe, or cleaning recipe is not limited to a newly prepared recipe and may be prepared, for example, by modifying an existing recipe that is already installed in the substrate processing apparatus. When the recipe is modified, the modified recipe may be installed to the substrate processing apparatus through an electrical communication line or a recording medium in which the recipe is recorded. In addition, the recipe previously installed in the existing substrate processing apparatus may be directly changed by manipulating the input/output device 281 of the substrate processing apparatus.

It has been described as an example in the above-described embodiments that the film forming process, the modification process of deposit, and the cleaning process are performed using a single-wafer type substrate processing apparatus in which one or several substrates are processed at a time. The present disclosure is not limited to the above-described embodiments but may be appropriately applied to a case in which the various processes are performed, for example, using a batch type substrate processing apparatus in which a plurality of substrates are processed at a time. In addition, it has been described as an example in the above-described embodiments that the substrate processing apparatus having a warm wall type processing furnace is used to perform the various processes. The present disclosure is not limited to the above-described embodiments but may be appropriately applied to a case in which a substrate processing apparatus having a cold wall type processing furnace or a hot wall type processing furnace is used to perform the various processes. Even in these cases, the processing procedures and processing conditions may be set to be the same, for example, as the processing procedures and processing conditions of the above-described embodiments.

Figure 11:
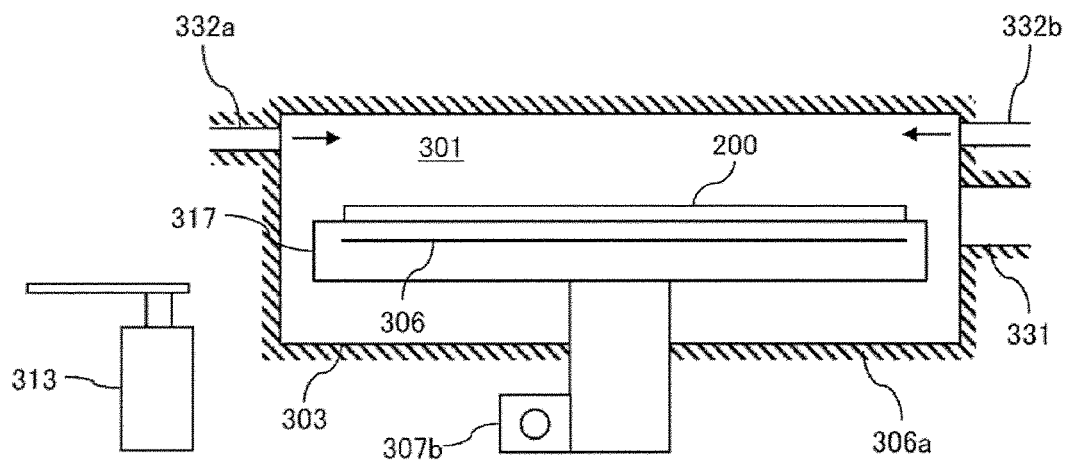
FIG. 11 is a schematic view of a configuration of a processing furnace of a substrate processing apparatus appropriately used in another embodiment of the present disclosure, showing a portion of the processing furnace in a longitudinal sectional view.

In addition, for example, even when a side flow type (cross flow type) processing furnace 302 shown in FIG. 11 is used, the present disclosure may be appropriately applied. The processing furnace 302 is provided with a process vessel 303 defining a process chamber 301, a mounting table 317 for horizontally supporting a single or several wafers 200, a heater 306 provided in the mounting table 317, an elevation mechanism 307b for elevating the mounting table 317, and a transfer robot 313 for transferring the wafer 200 into the process vessel 303. A gas supply port 332a for supplying the above-described precursor gas, the modifying gas, the cleaning gas, and the heating promotion gas and a gas supply port 332b for supplying the above-described reaction gas are connected to an upper portion of a sidewall (a portion of the sidewall near a ceiling portion) of the process vessel 303. The same gas supply systems as the precursor gas supply system, the modifying gas supply system, the cleaning gas supply system, and the heating promotion gas supply system of the above-described embodiments are connected to the gas supply port 332a. The same gas supply system as the reaction gas supply system of the above-described embodiments is connected to the gas supply port 332b. An exhaust port 331 for exhausting the interior of the process chamber 301 is installed at the process vessel 303. The same exhaust system as the exhaust system of the above-described embodiments is connected to the exhaust port 331. A sub-heater 306a for heating the process vessel 303, the gas supply port 332a, and the exhaust port 331 to several tens to 150 degrees C. or so is installed therearound.

Figure 12:
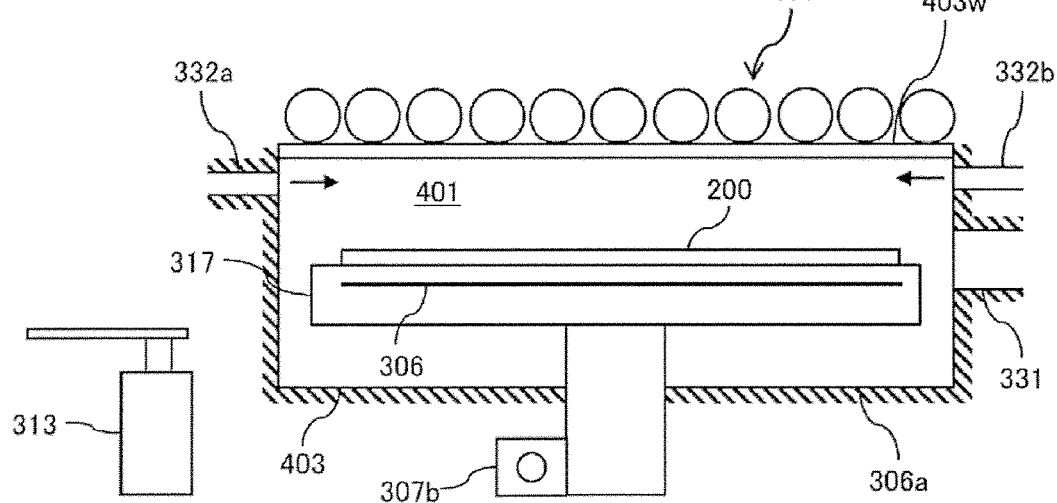
FIG. 12 is a schematic view of a configuration of a processing furnace of a substrate processing apparatus appropriately used in another embodiment of the present disclosure, showing a portion of the processing furnace in a longitudinal sectional view.

In addition, for example, even when a side flow type processing furnace 402 shown in FIG. 12 is used, the present disclosure may be appropriately applied. The processing furnace 402 is provided with a process vessel 403 defining process chamber 401, a lamp heater 406 for irradiating the wafer 200 in the process vessel 403 with light, and a quartz window 403w through which the light of the lamp heater 406 transmits. The other configurations are the same manner as the processing furnace 302 shown in FIG. 11.

Even when these substrate processing apparatuses are used, the film forming process, the modification process of deposit, and the cleaning process may be performed in the same sequences and processing conditions as the above-described embodiments or modification examples, and the same effects as those obtained in the above-described embodiments are obtained.

In addition, the embodiments, the modification examples and the like described above may be used in appropriate combination. Further, the processing conditions at that time may be set to be the same, for example, as the processing conditions of the above-described embodiments.

<Aspects of Present Disclosure>

Hereinafter, some aspects of the present disclosure are additionally described as supplementary notes.

(Supplementary Note 1)

An aspect of the present disclosure may provide a method of manufacturing a semiconductor device including: loading a substrate into a process chamber; supporting the substrate by a mounting table having a heater therein in the process chamber; forming a film on the substrate by supplying a processing gas into the process chamber in a state where the mounting table having the substrate supported thereon is disposed in a first position and the heater is turned on; unloading the substrate on which the film is formed from the process chamber; and supplying a reactive gas into the process chamber in a state where the mounting table is disposed in a second position and the heater is turned on, the second position being closer to a ceiling portion in the process chamber than the first position.

(Supplementary Note 2)

In the method according to Supplementary Note 1, wherein the act of supplying the reactive gas may include modifying a deposit attached onto an interior of the process chamber when the film is formed on the substrate by supplying a modifying gas serving as the reactive gas into the process chamber.

(Supplementary Note 3)

In the method according to Supplementary Note 1 or 2, wherein the act of supplying the reactive gas may include removing a deposit attached onto an interior of the process chamber when the film is formed on the substrate by supplying a cleaning gas serving as the reactive gas into the process chamber.

(Supplementary Note 4)

In the method according to Supplementary Note 3, wherein a distance between the mounting table and the ceiling portion in the act of modifying the deposit may be set to be different from a distance between the mounting table and the ceiling portion in the act of removing the deposit. More specifically, the distance between the mounting table and the ceiling portion in the act of modifying the deposit may be set to be shorter than the distance between the mounting table and the ceiling portion in the act of removing the deposit. That is, the mounting table in the act of modifying the deposit is disposed in a position closer to the ceiling portion in the process chamber than the mounting table in the act of removing the deposit.

(Supplementary Note 5)

In the method according to any one of Supplementary Notes 1 to 4, wherein in the act of supplying the reactive gas, the mounting table may be maintained in the second position in a state where the heater is turned on.

(Supplementary Note 6)

In the method according to any one of Supplementary Notes 1 to 4, wherein the act of supplying the reactive gas may include: locating the mounting table in a third position closer to the ceiling portion in the process chamber than the second position in a state where the heater is turned on; and locating the mounting table in the second position in a state where the heater is turned on after the act of locating the mounting table in the third position.

(Supplementary Note 7)

In the method according to any one of Supplementary Notes 1 to 4, the act of supplying the reactive gas may include moving the mounting table in a space between the second position and a fourth position in a state where the heater is turned on, the fourth position being set to be different from the second position. For example, the fourth position may indicate a position in which the mounting table is disposed when the substrate is loaded into the process chamber. Additionally or alternatively, the fourth position may indicate a position in which the mounting table is disposed when the substrate is unloaded from the process chamber. In some cases, the fourth position may indicate a position in which the mounting table is disposed when the substrate is transferred into or out of the process chamber.

(Supplementary Note 8)

In the method according to any one of Supplementary Notes 1 to 7, wherein in the act of supplying the reactive gas, a gas having a heat conductivity higher than the reactive gas may be supplied into the process chamber before supplying the reactive gas into the process chamber. More specifically, a gas having a heat conductivity higher than the reactive gas may be supplied into the process chamber before supplying the reactive gas into the process chamber and sealed in the process chamber.

(Supplementary Note 9)

In the method according to any one of Supplementary Notes 1 to 8, in the act of supplying the reactive gas, at least one selected from the group consisting of a hydrogen gas and a helium gas may be supplied into the process chamber before supplying the reactive gas into the process chamber. More specifically, at least any one of a hydrogen gas and a helium gas may be supplied into the process chamber before supplying the reactive gas into the process chamber.

(Supplementary Note 10)

In the method according to any one of Supplementary Notes 1 to 9, wherein the processing gas may be supplied into the process chamber from a gas supply part installed in the ceiling portion. More specifically, the reactive gas may be supplied into the process chamber from the gas supply part.

(Supplementary Note 11)

In the method according to any one of Supplementary Notes 1 to 9, wherein the processing gas may be supplied into the process chamber from a shower head installed in the ceiling portion. More specifically, the reactive gas is supplied into the process chamber from the shower head.

(Supplementary Note 12)

In the method according to any one of Supplementary Notes 1 to 9, wherein the processing gas may be supplied into the process chamber from a gas supply part installed in a lateral side of the process chamber. More specifically, the reactive gas may be supplied into the process chamber from the gas supply part.

(Supplementary Note 13)

In the method according to any one of Supplementary Notes 1 to 12, wherein the processing gas may include a precursor gas having chemical bonds between a first element and carbon. The precursor gas may contain a first element, carbon and a halogen element and have chemical bonds between the first element and carbon.

(Supplementary Note 14)

In the method according to any one of Supplementary Notes 1 to 12, wherein the processing gas may include a precursor gas having chemical bonds between a first element and carbon and a reaction gas containing a second element (and a reaction gas containing a third element).

(Supplementary Note 15)

In the method according to any one of Supplementary Notes 1 to 12, wherein the processing gas may include a precursor gas containing a first element and a reaction gas containing carbon.

(Supplementary Note 16)

In the method according to any one of Supplementary Notes 1 to 12, wherein the processing gas may include a precursor gas containing a first element, a reaction gas containing carbon, and a reaction gas containing a second element (and a reaction gas containing a third element).

(Supplementary Note 17)

Another aspect of the present disclosure may provide a method of manufacturing a semiconductor device and a method of processing a substrate including: loading a substrate into a process chamber; supporting the substrate by a mounting table having a heater therein in the process chamber; forming a film on the substrate by supplying a processing gas into the process chamber in a state where the mounting table having the substrate supported thereon is disposed at a first level (first height) and the heater is turned on; unloading the substrate on which the film is formed from the process chamber; modifying a deposit attached onto an interior of the process chamber when the film is formed on the substrate by supplying a modifying gas into the process chamber in a state where the mounting table is disposed at a second level (second height) closer to a ceiling portion in the process chamber than the first level and the heater is turned on; and removing the deposit attached onto the interior of the process chamber when the film is formed on the substrate by supplying a cleaning gas into the process chamber in a state where the mounting table is disposed at a third level (third height) closer to the ceiling portion in the process chamber than the first level and the heater is turned on.

(Supplementary Note 18)

In the method according to Supplementary Note 17, wherein the third level may be different from the second level. More specifically, the third level may be closer to the ceiling portion in the process chamber than the second level.

(Supplementary Note 19)

Another aspect of the present disclosure may provide a substrate processing apparatus including: a process chamber configured to accommodate a substrate; a mounting table configured to support the substrate in the process chamber; a heater provided in the mounting table; a mounting table moving part configured to move the mounting table; a gas supply system configured to supply a gas into the process chamber; a transfer unit configured to transfer the substrate into or out of the process chamber; and a controller configured to control the transfer unit, the mounting table moving part, the heater and the gas supply system so as to perform: loading the substrate into the process chamber; supporting the substrate by the mounting table in the process chamber; forming a film on the substrate by supplying a processing gas into the process chamber in a state where the mounting table having the substrate supported thereon is disposed in a first position and the heater is turned on; unloading the substrate on which the film is formed from the process chamber; and supplying a reactive gas into the process chamber in a state where the mounting table is disposed in a second position and the heater is turned on, the second position being closer to a ceiling portion in the process chamber than the first position.

(Supplementary Note 20)

Another aspect of the present disclosure may provide a program and a non-transitory computer-readable recording medium storing the program causes a computer to perform a process of: loading a substrate into a process chamber; supporting the substrate by a mounting table having a heater therein in the process chamber; forming a film on the substrate by supplying a processing gas into the process chamber in a state where the mounting table having the substrate supported thereon is disposed in a first position and the heater is turned on; unloading the substrate on which the film is formed from the process chamber; and supplying a reactive gas into the process chamber in a state where the mounting table is disposed in a second position and the heater is turned on, the second position being closer to a ceiling portion in the process chamber than the first position.

According to the present disclosure, it is possible to suppress the generation of particles in a process chamber in which a film forming process is performed.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    loading a substrate into a process chamber;
    supporting the substrate by a mounting table having a heater therein in the process chamber;
    forming a film on the substrate by supplying a processing gas into the process chamber in a state where the mounting table having the substrate supported thereon is disposed in a first position and the heater is turned on;
    unloading the substrate on which the film is formed from the process chamber;
    moving up the mounting table to a second position, the second position being closer to a ceiling portion in the process chamber than the first position; and
    supplying a modifying gas and a cleaning gas into the process chamber in a state where the mounting table is disposed in the second position and the heater is turned on,
    wherein the act of supplying the modifying gas and the cleaning gas includes:
        modifying a deposit attached onto an interior of the process chamber when the film is formed on the substrate by supplying an oxygen containing gas as the modifying gas into the process chamber without supplying the cleaning gas; and
        removing the deposit modified in the act of modifying the deposit by supplying a fluorine containing gas as the cleaning gas into the process chamber without supplying the oxygen containing gas.

2. The method of claim 1,
    wherein a distance between the mounting table and the ceiling portion in the act of modifying the deposit is set to be different from a distance between the mounting table and the ceiling portion in the act of removing the deposit.

3. The method of claim 2, wherein the distance between the mounting table and the ceiling portion in the act of modifying the deposit is set to be shorter than the distance between the mounting table and the ceiling portion in the act of removing the deposit.

4. The method of claim 1, wherein in the act of supplying the modifying gas and the cleaning gas, the mounting table is maintained in the second position in a state where the heater is turned on.

5. The method of claim 1, wherein the act of supplying the modifying gas and the cleaning gas includes:
    locating the mounting table in a third position closer to the ceiling portion in the process chamber than the second position in a state where the heater is turned on; and
    locating the mounting table in the second position in a state where the heater is turned on after the act of locating the mounting table in the third position.

6. The method of claim 1, wherein the act of supplying the modifying gas and the cleaning gas includes moving the mounting table in a space between the second position and a fourth position in a state where the heater is turned on, the fourth position being set to be different from the second position.

7. The method of claim 1, wherein in the act of supplying the modifying gas and the cleaning gas, a gas having a heat conductivity higher than the modifying gas and the cleaning gas is supplied into the process chamber before supplying the modifying gas and the cleaning gas into the process chamber.

8. The method of claim 1, wherein in the act of supplying the modifying gas and the cleaning gas, at least one selected from the group consisting of a hydrogen gas and a helium gas is supplied into the process chamber before supplying the modifying gas and the cleaning gas into the process chamber.

9. The method of claim 1, wherein the processing gas is supplied into the process chamber from a gas supply part installed in the ceiling portion.

10. The method of claim 1, wherein the processing gas is supplied into the process chamber from a shower head installed in the ceiling portion.

11. The method of claim 1, wherein the processing gas is supplied into the process chamber from a gas supply part installed in a lateral side of the process chamber.

12. The method of claim 1, wherein the processing gas includes a precursor gas having chemical bonds between a first element and carbon.

13. The method of claim 1, wherein the processing gas includes a precursor gas containing a first element, carbon and a halogen element and having chemical bonds between the first element and carbon.

14. The method of claim 1, wherein the processing gas includes a precursor gas having chemical bonds between a first element and carbon and a reaction gas containing a second element.

15. The method of claim 1, wherein the processing gas includes a precursor gas containing a first element and a reaction gas containing carbon.

16. The method of claim 1, wherein the processing gas includes a precursor gas containing a first element, a first reaction gas containing carbon, and a second reaction gas containing a second element.

17. A substrate processing apparatus, comprising:
a process chamber configured to accommodate a substrate;
a mounting table configured to support the substrate in the process chamber;
a heater provided in the mounting table;
a mounting table moving part configured to move the mounting table;
a gas supply system configured to supply a gas into the process chamber;
a transfer unit configured to transfer the substrate into or out of the process chamber; and
a controller configured to control the transfer unit, the mounting table moving part, the heater and the gas supply system so as to perform:
loading the substrate into the process chamber;
supporting the substrate by the mounting table in the process chamber;
forming a film on the substrate by supplying a processing gas into the process chamber in a state where the mounting table having the substrate supported thereon is disposed in a first position and the heater is turned on;
unloading the substrate on which the film is formed from the process chamber;
moving up the mounting table to a second position, the second position being closer to a ceiling portion in the process chamber than the first position; and
supplying a modifying gas and a cleaning gas into the process chamber in a state where the mounting table is disposed in the second position and the heater is turned on,
wherein the act of supplying the modifying gas and the cleaning gas includes:
modifying a deposit attached onto an interior of the process chamber when the film is formed on the substrate by supplying an oxygen containing gas as the modifying gas into the process chamber without supplying the cleaning gas; and
removing the deposit modified in the act of modifying the deposit by supplying a fluorine containing gas as the cleaning gas into the process chamber without supplying the oxygen containing gas.

18. A non-transitory computer-readable recording medium storing a program that causes a computer to perform processes of:
loading a substrate into a process chamber;
supporting the substrate by a mounting table having a heater therein in the process chamber;
forming a film on the substrate by supplying a processing gas into the process chamber in a state where the mounting table having the substrate supported thereon is disposed in a first position and the heater is turned on;
unloading the substrate on which the film is formed from the process chamber;
moving up the mounting table to a second position, the second position being closer to a ceiling portion in the process chamber than the first position; and
supplying a modifying gas and a cleaning gas into the process chamber in a state where the mounting table is disposed in the second position and the heater is turned on,
wherein the act of supplying the modifying gas and the cleaning gas includes:
modifying a deposit attached onto an interior of the process chamber when the film is formed on the substrate by supplying an oxygen containing gas as the modifying gas into the process chamber without supplying the cleaning gas; and
removing the deposit modified in the act of modifying the deposit by supplying a fluorine containing gas as the cleaning gas into the process chamber without supplying the oxygen containing gas.

19. The method of claim 1, wherein the oxygen containing gas is at least one selected from a group consisting of $O_2$ gas, $N_2O$ gas, $NO_2$ gas, $O_3$ gas, $H_2O$, CO gas, and $CO_2$ gas.

20. The method of claim 1, wherein the fluorine containing gas is at least one selected from a group consisting of $F_2$ gas, $ClF_3$ gas, $NF_3$ gas, and HF gas.

21. The method of claim 1, wherein in the act of modifying the deposit, Si—C bondings in the deposit are substituted with Si—O bondings and a C concentration in the deposit is decreased.

* * * * *